United States Patent
Tsukao

(10) Patent No.: US 10,373,927 B2
(45) Date of Patent: Aug. 6, 2019

(54) CONNECTION BODY AND METHOD OF MANUFACTURING CONNECTION BODY

(71) Applicant: DEXERIALS CORPORATION, Tokyo (JP)

(72) Inventor: Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 94 days.

(21) Appl. No.: 15/324,759

(22) PCT Filed: Jul. 22, 2015

(86) PCT No.: PCT/JP2015/070884
§ 371 (c)(1),
(2) Date: Jan. 9, 2017

(87) PCT Pub. No.: WO2016/013593
PCT Pub. Date: Jan. 28, 2016

(65) Prior Publication Data
US 2017/0207190 A1    Jul. 20, 2017

(30) Foreign Application Priority Data

Jul. 22, 2014 (JP) ................................. 2014-149298
Nov. 28, 2014 (JP) ................................. 2014-242270

(51) Int. Cl.
*H01L 23/00* (2006.01)
*H01L 23/498* (2006.01)
(Continued)

(52) U.S. Cl.
CPC ........ *H01L 24/73* (2013.01); *H01L 23/49811* (2013.01); *H01L 23/49838* (2013.01);
(Continued)

(58) Field of Classification Search
CPC ... H01L 24/81; H01L 24/73; H01L 23/49811; H01L 23/49838
See application file for complete search history.

(56) References Cited

U.S. PATENT DOCUMENTS

| 5,769,996 A * | 6/1998 | McArdle ................... H01F 1/44 |
| | | 156/272.4 |
| 7,486,284 B2 | 2/2009 | Hwang et al. |

(Continued)

FOREIGN PATENT DOCUMENTS

| CN | 1629917 A | 6/2005 |
| JP | H11-31717 A | 2/1999 |

(Continued)

OTHER PUBLICATIONS

Oct. 20, 2015 Search Report issued in International Patent Application No. PCT/JP2015/070884.
(Continued)

*Primary Examiner* — Tucker J Wright
*Assistant Examiner* — Wilner Jean Baptiste
(74) *Attorney, Agent, or Firm* — Oliff PLC

(57) ABSTRACT

A connection body includes a circuit board terminals arranged into terminal rows, the terminals rows being arranged in parallel to one another in a widthwise direction orthogonal to a direction in which the terminals are arranged, and an electronic component including bumps arranged into bump rows corresponding to the terminal rows, the bumps being arranged in parallel to one another in a widthwise direction orthogonal to a direction in which the bumps are arranged. The electronic component is connected upon the circuit board interposed by an anisotropic conductive adhesive including electrically conductive particles arranged therein. A distance between mutually opposing terminals of the terminals and bumps of the bumps arranged toward the outer sides of the circuit board and the electronic component is greater than a distance between mutually opposing terminals of the terminals and bumps of the bumps arranged toward their inner sides.

14 Claims, 7 Drawing Sheets

(51) Int. Cl.
*H05K 3/32* (2006.01)
*G02F 1/1345* (2006.01)
*H01L 21/66* (2006.01)
*H01R 4/04* (2006.01)
*H01R 12/70* (2011.01)
*H01R 13/24* (2006.01)
*H05K 1/11* (2006.01)

(52) U.S. Cl.
CPC .............. *H01L 24/14* (2013.01); *H01L 24/17* (2013.01); *H01L 24/32* (2013.01); *H01L 24/81* (2013.01); *H01L 24/83* (2013.01); *H01L 24/92* (2013.01); *H05K 3/323* (2013.01); *G02F 1/13458* (2013.01); *G02F 2202/28* (2013.01); *H01L 22/14* (2013.01); *H01L 2224/13017* (2013.01); *H01L 2224/13019* (2013.01); *H01L 2224/13144* (2013.01); *H01L 2224/13147* (2013.01); *H01L 2224/16012* (2013.01); *H01L 2224/16225* (2013.01); *H01L 2224/16227* (2013.01); *H01L 2224/2929* (2013.01); *H01L 2224/29311* (2013.01); *H01L 2224/29316* (2013.01); *H01L 2224/29324* (2013.01); *H01L 2224/29339* (2013.01); *H01L 2224/29344* (2013.01); *H01L 2224/29357* (2013.01); *H01L 2224/29371* (2013.01); *H01L 2224/32225* (2013.01); *H01L 2224/73204* (2013.01); *H01L 2224/81132* (2013.01); *H01L 2224/81191* (2013.01); *H01L 2224/81203* (2013.01); *H01L 2224/83132* (2013.01); *H01L 2224/83192* (2013.01); *H01L 2224/83203* (2013.01); *H01L 2224/9211* (2013.01); *H01L 2924/1426* (2013.01); *H01R 4/04* (2013.01); *H01R 12/7076* (2013.01); *H01R 13/2414* (2013.01); *H05K 1/111* (2013.01); *H05K 2201/0269* (2013.01); *H05K 2201/09409* (2013.01)

(56) References Cited

U.S. PATENT DOCUMENTS

| | | | |
|---|---|---|---|
| 2005/0155706 A1* | 7/2005 | Nishida | H01L 21/563 156/312 |
| 2015/0279792 A1* | 10/2015 | Matsui | G02F 1/13452 257/737 |

FOREIGN PATENT DOCUMENTS

| | | |
|---|---|---|
| JP | H11-307902 A | 11/1999 |
| JP | 2000-340613 A | 12/2000 |
| JP | 2003-202583 A | 7/2003 |
| JP | 2003-303852 A | 10/2003 |
| JP | 2004-214374 A | 7/2004 |
| JP | 2005-203758 A | 7/2005 |
| JP | 2005-216611 A | 8/2005 |
| JP | 2007-035828 A | 2/2007 |
| JP | 2008-210908 A | 9/2008 |
| JP | 4789738 B2 | 10/2011 |
| WO | 2014/034102 A1 | 3/2014 |

OTHER PUBLICATIONS

Sep. 4, 2018 Office Action issued in Chinese Patent Application No. 201580035591.9.

Nov. 1, 2018 Office Action issued in Japanese Patent Application No. 2014-242270.

* cited by examiner

CONNECTION BODY AND METHOD OF MANUFACTURING CONNECTION BODY

TECHNICAL FIELD

The present invention relates to a connection body in which an electronic component and a circuit board are connected, and in particular relates to a connection body in which an electronic component is connected to a circuit board interposed by an adhesive that contains electrically conductive particles, and also relates to a method of manufacturing such a connection body.

The present application asserts priority based upon Japanese Patent Application No. 2014-149298 filed in Japan on 22 Jul. 2014 and Japanese Patent Application No. 2014-242270 filed in Japan on 28 Nov. 2014, and hereby incorporates these applications by reference.

BACKGROUND ART

From the past, liquid crystal display devices and organic EL panels have been used as display means of various types, such as monitors for televisions or PC monitors, displays for portable telephones or smartphones, displays for portable type game machines, displays for tablet terminals or wearable terminals, or displays for use in vehicles or the like. In recent years, in display devices of this type, from the standpoint of providing finer pitch, reducing weight, and enhancing thinness, various manufacturing methods have been employed. In such manufacturing methods, drive ICs are mounted directly upon a glass board of a display panel, or a flexible board upon which drive circuitry or the like is formed is mounted directly upon a glass board of a display panel with the use of anisotropic conductive film (ACF).

A plurality of transparent electrodes made from indium tin oxide (ITO) or the like are formed upon a glass board to which ICs or a flexible board are to be mounted. Electronic components such as ICs or a flexible board are connected upon these transparent electrodes. In such electronic components that are to be connected to the glass board, a plurality of electrode terminals corresponding to the transparent electrodes are formed upon their mounting surfaces. The electronic components are thermocompression-bonded to the glass board interposed by an anisotropic conductive film. As a result, the electrode terminals and the transparent electrodes are connected.

An anisotropic conductive film is made by mixing electrically conductive particles into a binder resin and shaping the result into a film. The anisotropic conductive film is thermocompression-bonded between two electrical conductors, thereby providing electrical continuity between two electrical conductors and maintaining mechanical connection between two electrical conductors. A thermosetting binder resin having high reliability is commonly employed as the adhesive incorporated in such an anisotropic conductive film. A photocurable binder resin or a photo-thermal dual curing type binder resin may also be employed as the adhesive.

When an electronic component is connected to a transparent electrode interposed by such an anisotropic conductive film, first, the anisotropic conductive film is provisionally adhered upon the transparent electrode of the grass board with a provisional pressure bonding means. And, next, after a temporary connection body has formed by mounting the electronic component upon the glass board interposed by the anisotropic conductive film, the electronic component is heated and pressed toward the transparent electrode along with the anisotropic conductive film by a thermocompression bonding means such as a thermocompression bonding head or the like. By applying heat with this thermocompression bonding head, the anisotropic conductive film undergoes a thermal hardening reaction, and due to this, the electronic component is adhered upon the transparent electrode.

CITATION LIST

Patent Literature

Patent Document 1: Japanese Patent No. 4789738B

Patent Document 2: Japanese Unexamined Patent Application Publication No. 2004-214374A Patent Document 3: Japanese Unexamined Patent Application Publication No. 2005-203758A

SUMMARY OF INVENTION

Technical Problem

In an IC chip 50 that is to be used for this type of COG connection, as illustrated in FIG. 10A, for example, an input bump region 52 in which input bumps 51 are arranged in a row is formed along one side edge 50a of the surface of the chip that is to be mounted to a glass board 56, and an output bump region 54 in which output bumps 53 are arranged in two rows in a staggered manner is provided along the other side edge 50b that opposes the one side edge 50a. Depending upon the type of IC chip, there are various types of such bump arrangements, but, with a typical IC chip provided with such bumps, the number of output bumps 53 is greater than the number of input bumps 51, and the area of the output bump region 54 is greater than the area of the input bump region 52, with the shapes of the input bumps 51 being formed to be larger than the shapes of the output bumps 53.

Moreover, with such an IC chip 50 provided with bumps, the input bumps 51 are formed along one of a pair of opposite side edges, and, due to the output bumps 53 being formed along the other side edge, these input and output bumps are separated from one another, and a region is present in the central portion in which no bumps are formed.

Furthermore, with such an IC chip 50, the bump arrangements and the bump sizes are different between the input bumps 51 and the output bumps 53, and the bumps are arranged asymmetrically upon the mounting surface. And, in the case of an IC chip such as a drive IC that is used in various types of liquid crystal display panels such as in a smartphone, along with progressive increase in the number of pixels, there is a tendency for the number of output signals corresponding to the pixels also to increase so that the number of output bumps also increases, and therefore designs are currently being proposed in which, by contrast to the input bumps 51 that are formed along one side edge of the chip and are arranged in a row, the output bumps 53 that are formed along the other side edge of the chip are arranged in two or three rows or more.

Yet further, along with the evolution of mobile devices such as smartphones, tablet terminals, wearable terminals and the like in recent years to become more compact and thinner, IC chips 50 are being designed to be wider and thinner, and because the region between the input and output bumps is being made to be wider, it became easier for the region between the bumps to be deformed by pressure exerted perpendicular to the surface.

Due to this, as illustrated in FIG. 10B, when heat and pressure are applied with a thermocompression bonding head 58 during connection of the IC chip 50 to a circuit board 56, elimination of the binder resin of the anisotropic conductive film 55 progresses in the region between the bumps at the center where neither the input bumps 51 nor the output bumps 53 are formed, and bending may occur (refer to FIG. 11). As a result, with this IC chip 50, the output bumps 53b formed on the outer side edge of the circuit board come to be in a state of floating upward from the transparent electrodes 57 of the glass board 56 as compared to the output bumps 53a formed more inward upon the board, so that the pressure upon the electrically conductive particles 60 at those locations becomes weak, and there is a fear that the electrical connections may become poor.

Thus, from the standpoint of enhancing productivity, a testing process is performed subsequent to connection, in order to verify that electrical continuity has been ensured by the electrically conductive particles 60 being properly crushed between the input and output bumps 51 and 53 of the IC chip 50 and the transparent electrodes 57 of the glass board 56. Here, as such a test after connection, in some cases an external appearance test is performed by observing, from the rear surface of the glass board 56, the indentations of the electrically conductive particles 60 that can be viewed upon the transparent electrodes 57.

However, the quality of the indentations is evaluated functionally by visual inspection by a human being, and this procedure is inherently ambiguous as a decision standard. Comparison is also performed with peripheral regions where no electrically conductive particles 60 are present. Accordingly, if electrically conductive particles 60 are overlapped between the bumps and the transparent electrodes 57, or if electrically conductive particles 60 continuously contact one another or approach one another too closely in the in-plane direction of the transparent electrodes 57, then identification between the indentations and the peripheral regions may become poor, in other words, the visibility which is influenced by contrast and hue may become worse, and there is a fear that it may become impossible to perform quick and appropriate external appearance testing.

Thus, an object of the present invention is to provide a connection body and a method of manufacturing such a connection body. In such a connection body, it is possible to easily determine whether or not, as compared to electrically conductive particles crushed between bumps formed toward the interior of an IC chip and electrodes on a circuit board, electrically conductive particles have been appropriately squashed between bumps formed upon an edge of the IC chip toward its outside and electrodes upon the circuit board to which the IC chip is mounted, so that satisfactory electrical continuity is ensured.

Solution to Problem

In order to solve the problem described above, a connection body according to the present invention includes a circuit board and an electronic component. The circuit board includes a plurality of terminals arranged into a plurality of terminal rows. The plurality of terminal rows are arranged in parallel to one another in a widthwise direction orthogonal to a direction in which the plurality of terminals are arranged. The electronic component includes a plurality of bumps arranged into a plurality of bump rows corresponding to the plurality of terminal rows. The plurality of bump rows are arranged in parallel to one another in a widthwise direction orthogonal to a direction in which the plurality of bumps are arranged. In the connection body, the electronic component is connected upon the circuit board interposed by an anisotropic conductive adhesive including electrically conductive particles arranged therein. A distance between mutually opposing terminals of the plurality of terminals and bumps of the plurality of bumps arranged toward outer sides of the circuit board and the electronic component is greater than a distance between mutually opposing terminals of the plurality of terminals and bumps of the plurality of bumps arranged toward inner sides of the circuit board and the electronic component.

Moreover, in a method according to the present invention of manufacturing a connection body, the connection body includes a circuit board and an electronic component. The circuit board includes a plurality of terminals arranged into a plurality of terminal rows. The plurality of terminal rows are arranged in parallel to one another in a widthwise direction. The electronic component includes a plurality of bumps arranged into a plurality of bump rows corresponding to the plurality of terminal rows. The plurality of bump rows are arranged in parallel to one another in a widthwise direction. The method including the steps of mounting the electronic component upon the circuit board interposed by an anisotropic conductive adhesive including electrically conductive particles arranged therein, and pressing the electronic component while hardening the anisotropic conductive adhesive. A distance between mutually opposing terminals of the plurality of terminals and bumps of the plurality of bumps arranged toward outer sides of the circuit board and the electronic component is greater than a distance between mutually opposing terminals of the plurality of terminals and bumps of the plurality of bumps arranged toward inner sides of the circuit board and the electronic component.

Advantageous Effects of Invention

According to the present invention, since the electronic component is connected upon the circuit board interposed by the anisotropic conductive adhesive including the electrically conductive particles arranged therein, even if the distance between the mutually opposing terminals and the bumps arranged toward the outer sides of the circuit board and the electronic component becomes greater than the distance between the mutually opposing terminals and the bumps arranged toward the inner sides of the circuit board and the electronic component, still this distance is kept within a predetermined range with respect to the distance between the terminals and the bumps arranged toward the inner sides. Thus, according to the present invention, it is possible to ensure satisfactory electrical continuity between the terminals and the bumps arranged toward the outer sides, in a similar manner to the case for the terminals and the bumps arranged toward the inner sides.

DESCRIPTION OF EMBODIMENTS

In the following, connection bodies to which the present invention is applied and methods of manufacturing such connection bodies will be described in detail with reference to the drawings. It should be understood that the present invention is not to be considered as being limited to the embodiments described below; of course, various alterations could be made, provided that there is no deviation from the gist of the present invention. Moreover, the drawings are only to be considered as being schematic; in some cases, the ratios of the dimensions illustrated are different from those actually employed. The concrete dimensions and the like must be determined with reference to the following explanation. Furthermore, of course, there are portions for which the relationships and ratios between the mutual dimensions are different between the various drawings.

Liquid Crystal Display Panel

Figure 1:
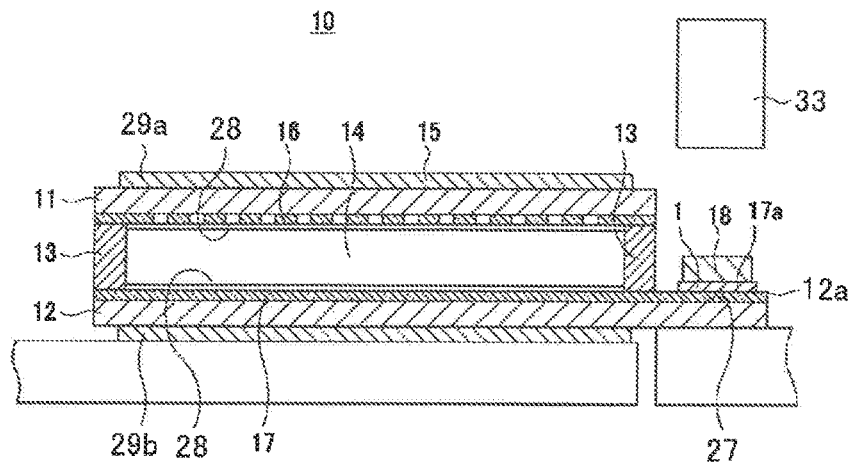
FIG. 1 is a sectional view of a liquid crystal display panel illustrated as an example of a connection body.

In the following, a liquid crystal display panel will be described as connection bodies to which the present invention is applied. In the liquid crystal display panel, one or more liquid crystal drive IC chips are mounted, as an electronic component, upon a glass board. As illustrated in FIG. 1, in this liquid crystal display panel 10, two transparent boards 11 and 12 made from glass board or the like are arranged so as to be mutually opposite each other, with these transparent boards 11 and 12 being glued to each other by a frame shaped seal 13. And a panel display unit 15 is formed using this liquid crystal display panel 10, with liquid crystal 14 being sealed within the space surrounded by the transparent boards 11 and 12.

A pair of transparent electrodes 16 and 17 shaped as bands made from indium tin oxide (ITO) or the like are formed upon the mutually opposing internal surfaces of the transparent boards 11 and 12, while mutually intersecting one another. Pixels are defined at the sites of intersection between the transparent electrodes 16 and 17, with these pixels constituting the minimum units of this liquid crystal display.

Figure 2:
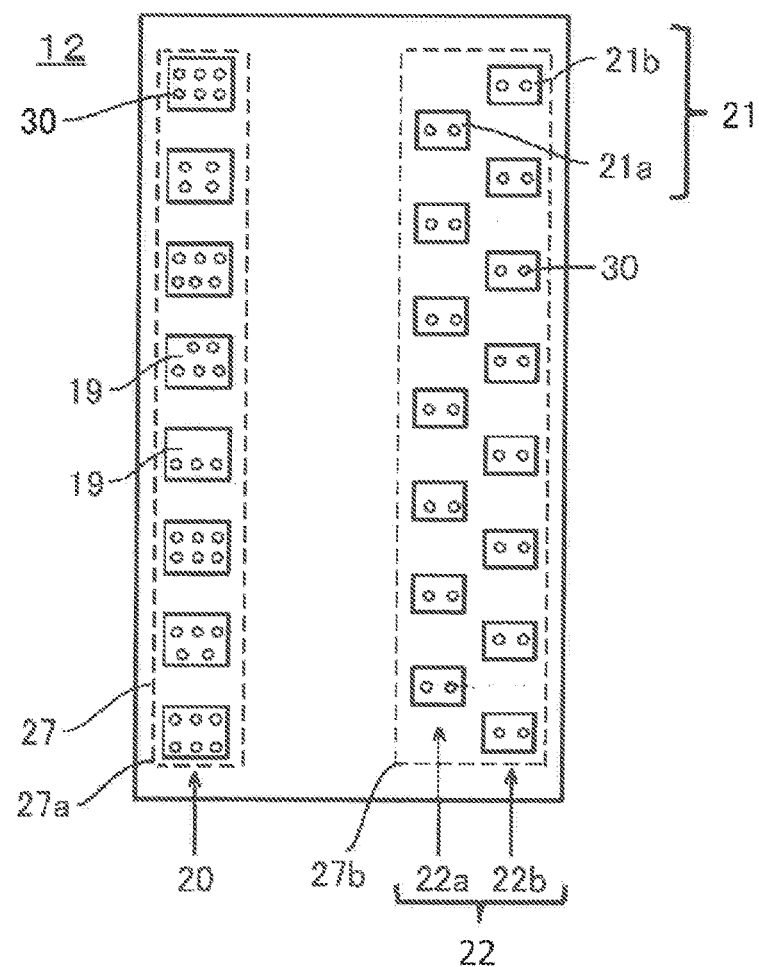
FIG. 2 is a bottom view illustrating the state of indentations that appear upon input and output terminals, as viewed from the rear surface of a transparent board.
Figure 3:
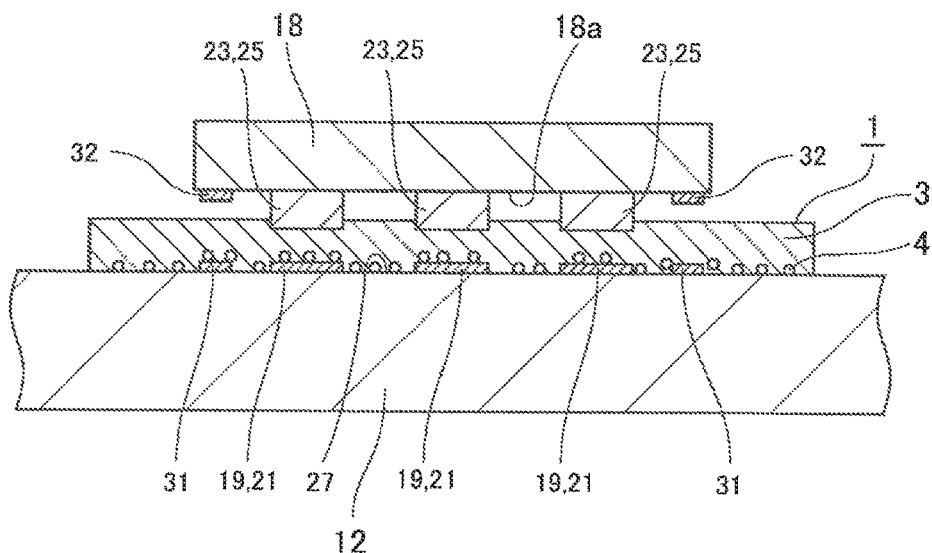
FIG. 3 is a sectional view illustrating a process of connection of a liquid crystal drive IC and a transparent board.

Among the two transparent boards 11 and 12, the transparent board 12 is formed with its planar dimensions being larger than those of the other transparent board 11, and a mounting portion 27 is provided at an edge 12a of the transparent board 12 formed to be larger. A liquid crystal drive IC 18 is mounted upon the mounting portion 27 as an electronic component. As illustrated in FIGS. 2 and 3, an input terminal row 20, an output terminal row 22, and board side alignment marks 31 are formed on the mounting portion 27. The input terminal row 20 includes a plurality of input terminals 19 of the transparent electrode 17 arranged in the input terminal row 20. The output terminal row 22 includes a plurality of output terminals 21 arranged in the output terminal row 22. The board side alignment marks 31 are to be superimposed on IC side alignment marks 32 provided on the liquid crystal drive IC 18.

The mounting portion 27, for example, include a first terminal region 27a in which a single input terminal row 20 is formed, and a second terminal region 27b in which two output terminal rows 22a and 22b are formed and arranged parallel to one another in the widthwise direction orthogonal to the direction in which the output terminals 21 are arranged. The output terminals 21 and the output terminal rows 22 include a first output terminal row 22a in which first output terminals 21a are arranged toward the inner side, i.e. on the side toward the input terminal row 20, and a second output terminal row 22b in which second output terminals 21b are arranged toward the outer side, i.e. on the side toward the outer edge of the mounting portion 27.

Figure 4:
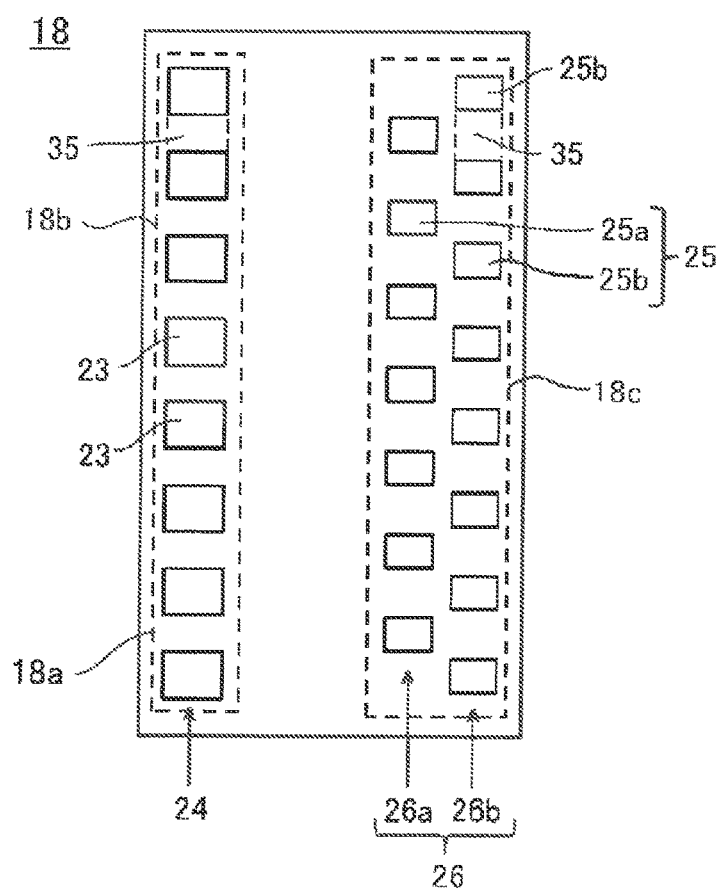
FIG. 4 is a plan view illustrating electrode terminals (bumps) of a liquid crystal drive IC and spaces between these terminals.

The liquid crystal drive IC 18 is configured to cause the orientation of a part of the liquid crystal to change by selectively applying liquid crystal drive voltages to the pixels so that a predetermined liquid crystal display can be provided. Moreover, as illustrated in FIGS. 3 and 4, the liquid crystal drive IC 18 includes an input bump row 24 and an output bump row 26 upon the mounting surface 18a of the liquid crystal drive IC 18 facing the transparent board 12. The input bump row 24 includes a plurality of input bumps 23 arranged in the input bump row 24 for providing electrically conductive connection to the input terminals 19 of the transparent electrode 17. The output bump row 26 includes a plurality of output bumps 25 arranged in the output bump row 26 for providing electrically conductive connection to the output terminals 21 of the transparent electrode 17. For example, copper bumps, gold bumps, or copper bumps that have been gold plated or the like may be suitably employed for the input bumps 23 and the output bumps 25.

The liquid crystal drive IC 18, for example, includes a first bump region 18b in which the input bumps 23 are arranged in a row along one side edge of the mounting surface 18a, and a second bump region 18c in which two output bump rows 26a and 26b are formed so as to lie parallel to one another in the widthwise direction orthogonal to the direction in which the output bumps 25 are arranged. The output bumps 25 and the output bump rows 26 include a first output bump row 26a in which first output bumps 25a are arranged toward the inner side, i.e. on the side toward the input bump row 24, and a second output bump row 26b in which second output bumps 25b are arranged toward the outer side, i.e., on the side toward the outer edge of the mounting surface 18a.

The first and second output bumps 25a and 25b are arranged in a staggered manner in a plurality of rows along the other side edge opposite to the aforementioned one side edge. The input and output bumps 23 and 25 and the input and output terminals 19 and 21 provided upon the mounting portion 27 of the transparent board 12 are formed in the same numbers and at the same pitches, and are connected together by the transparent board 12 and the liquid crystal drive IC 18 being positioned and connected together.

It should be understood that the arrangements of the input and output bump rows 24 and 26 in the first and second bump regions 18b and 18c may be different from those illustrated in FIG. 4. Any structure would be acceptable in which the input bump rows 24 are arranged in one or a plurality of rows along the one side edge of the mounting surface 18a, and the output bump rows 26 are arranged in one or a plurality of rows along the other side edge. Furthermore, in the input and output bump rows 24 and 26, it would be acceptable for a portion of the input and output bumps 23 and 25 arranged in one row to constitute a plurality of rows, or for a portion of the input and output bumps 23 and 25 arranged in a plurality of rows to constitute a single row. Moreover, in the input and output bump rows 24 and 26, it would be acceptable for the arrangement of the input and output bumps 23 and 25 in a plurality of rows to be formed in an aligned parallel arrangement, in which the bumps themselves are parallel and mutually adjacent; or, alternatively, it would also be acceptable for the arrangement of the input and output bumps 23 and 25 in a plurality of rows to be formed in a staggered arrangement, with even displacements between bumps that are parallel and mutually adjacent.

Furthermore, on the liquid crystal drive IC 18, along with the input and output bumps 23 and 25 being arranged along the long sides of the IC board, it would also be acceptable for side bumps to be formed along one or more of the short sides of the IC board. The input and output bumps 23 and 25 may be formed to be of the same dimensions; or of different dimensions. Moreover, in the input and output bump rows 24 and 26, the input and output bumps 23 and 25 formed to be of the same dimensions could be symmetrically or asymmetrically arranged in their bump rows. The input and output bumps 23 and 25 formed to be of different dimensions could be asymmetrically arranged in their bump rows.

In recent years, along with a trend to make electronic devices such as liquid crystal display devices and others more compact and to enhance their functions, electronic components such as liquid crystal drive ICs 18 and the like have also required to be more compact and lower in profile, and the heights of the input and output bumps 23 and 25 also have become lower (for example, from 6 to 15 µm).

Moreover, the IC side alignment marks 32 are formed upon the mounting surface 18a of the liquid crystal drive IC 18 in order for alignment with the transparent board 12 to be performed by superimposing these IC side alignment marks over the board side alignment marks 31. The alignment adjustment between the liquid crystal drive IC 18 and the transparent board 12 needs to be performed at high accuracy, since narrowing down of the wiring pitch of the transparent electrodes 17 of the transparent board 12 and of the pitch of the input and output bumps 23 and 25 of the liquid crystal drive IC 18 has progressed remarkably.

Marks of various types may be used as the board side alignment marks 31 and the IC side alignment marks 32, provided that good alignment between the transparent board 12 and the liquid crystal drive IC 18 may be obtained by matching these marks together.

The liquid crystal drive IC 18 is connected upon the input and output terminals 19 and 21 of the transparent electrode 17 formed upon the mounting portion 27 by using an anisotropic conductive film 1, which acts as an adhesive for circuit connection. The anisotropic conductive film 1 contains electrically conductive particles 4, and is provided for electrically connecting the input and output bumps 23 and 25 of the liquid crystal drive IC 18 and the input and output terminals 19 and 21 of the transparent electrode 17 formed upon the mounting portion 27 of the transparent board 12, interposed by the electrically conductive particles 4. By thermocompression bonding using a thermocompression bonding head 33, the binder resin in the anisotropic conductive film 1 is caused to flow so that the electrically conductive particles 4 are pressed and squashed between the input and output terminals 19 and 21 and the input and output bumps 23 and 25 of the liquid crystal drive IC 18, and then the binder resin is hardened in this state. Due to this processing, the anisotropic conductive film 1 electrically and mechanically connects the transparent board 12 and the liquid crystal drive IC 18.

Furthermore, alignment layers 28 are formed upon both the transparent electrodes 16 and 17. Predetermined rubbing processing is performed on the alignment layers 18. The initial alignments of the liquid crystal molecules come to be regulated by these alignment layers 28. Moreover, a pair of light polarizing plates 29a and 29b are disposed on the exterior surfaces of the two transparent boards 11 and 12. The direction of oscillation of transmitted light emitted from a light source such as a backlight or the like (not illustrated in the drawings) is regulated by these two light polarizing plates 29a and 29b.

Anisotropic Conductive Film

Figure 5:
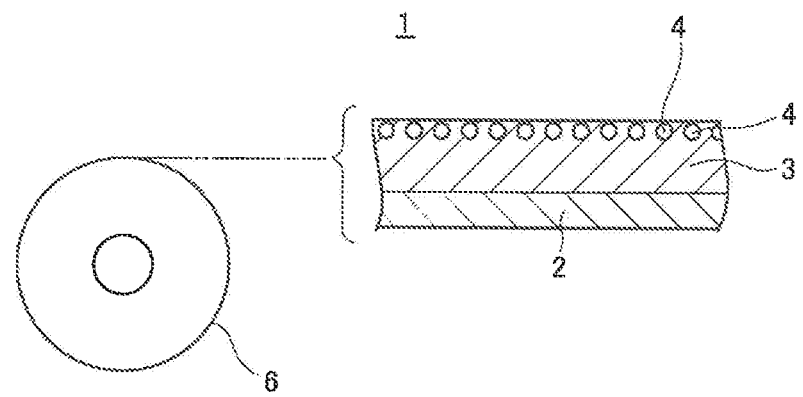
FIG. 5 is a sectional view illustrating an anisotropic conductive film.

Next, the anisotropic conductive film 1 will be described. As illustrated in FIG. 5, the anisotropic conductive film (ACF) 1 includes a binder resin layer (adhesive layer) 3 containing electrically conductive particles 4 formed on a release film 2 that serves as a base material. The anisotropic conductive film 1 is a thermosetting type adhesive or an optically curing type adhesive that is hardened by ultraviolet light or the like. The anisotropic conductive film 1 is adhered to the mounting portion 27 where the input and output terminals 19 and 21 of the transparent board 12 of the liquid crystal display panel 10 are formed. The liquid crystal drive IC 18 is mounted on the anisotropic conductive film 1. The anisotropic conductive film 1 is fluidized by the heat and pressure applied by the thermocompression bonding head 33 so that the electrically conductive particles 4 are pressed and squashed between the mutually opposing input and output terminals 19 and 21 of the transparent electrode 17 and input and output bumps 23 and 25 of the liquid crystal drive IC 18, and then is subjected to heat or is irradiated with ultraviolet rays so as to be hardened in this state in which the electrically conductive particles are pressed and squashed. Due to this, the anisotropic conductive film 1 can connect the transparent board 12 and the liquid crystal drive ICs 18, and can make them electrically continuous.

Furthermore, in this anisotropic conductive film 1, the electrically conductive particles 4 are regularly arranged in a predetermined pattern in the normal binder resin layer 3. The binder resin layer contains a film formation resin, a thermosetting resin, a latent curing agent, a silane coupling agent, and the like.

The release film 2 that supports the binder resin layer 3 is produced by applying a release agent such as silicone or the like to, for example polyethylene terephthalate (PET), oriented polypropylene (OPP), poly-4-methylpentene-1 (PMP), polytetrafluoroethylene (PTFE), or the like. The release film 2 prevents drying of the anisotropic conductive film 1 and also preserves the shape of the anisotropic conductive film 1.

As the film formation resin contained in the binder resin layer 3, a resin having average molecular weight of approximately from 10000 to 80000 is preferable. Examples of the film formation resin include various types of resins, such as epoxy resin, modified epoxy resin, urethane resin, and phenoxy resin. Among these, phenoxy resin is particularly preferable, from the standpoints of layer formation state, connection reliability, and the like.

The thermosetting resin is not particularly limited. Examples of the thermosetting resin include commercially available epoxy resin, acrylic resin, or the like.

While the abovementioned epoxy resin is not particularly limited, examples of the epoxy resin include naphthalene type epoxy resin, biphenyl type epoxy resin, phenol novolak type epoxy resin, bisphenol type epoxy resin, stilbene type epoxy resin, triphenol methane type epoxy resin, phenol aralkyl type epoxy resin, naphthol type epoxy resin, dicyclopentadiene type epoxy resin, triphenylmethane type epoxy resin, or the like. These substances may be used singly, or two or more types thereof may be used in combination.

While the abovementioned acrylic resin is not particularly limited, an acrylic compound, a liquid acrylate, or the like may be selected as appropriate, according to the objective. For example, examples of the acrylic resin include methyl acrylate, ethyl acrylate, isopropyl acrylate, isobutyl acrylate, epoxy acrylate, ethylene glycol diacrylate, diethylene glycol diacrylate, trimethylolpropane triacrylate, dimethylol tricyclodecane diacrylate, tetramethylene glycol tetraacrylate, 2-hydroxy-1, 3-diacryloxypropane, 2, 2-bis [4-(acryloxymethoxy) phenyl] propane, 2, 2-bis [4-(acryloxyethoxy) phenyl] propane, dicyclopentenyl acrylate, tricyclodecanyl acrylate, tris (acryloxyethyl) isocyanurate, urethane acrylate, epoxy acrylate, or the like. It is also possible to employ methacrylate as the acrylate. These substances may be used singly, or two or more types thereof may be used in combination.

While the abovementioned latent curing agent is not particularly limited, for example, hardeners of various types such as the heat curing type and the UV curing type may be suggested. Such a latent curing agent normally does not react, but is activated by a trigger of some type such as heat, light, pressure, or the like that is selected according to the application, whereupon the reaction starts. Methods for activating thermally activated type latent curing agents include: methods of generating active species (cations, anions, or radicals) by dissociation reaction due to application of heat or the like; methods of initiating the curing reaction by compatibilizing and dissolving curing agents which are stably dispersed in epoxy resin near room temperature, with epoxy resin at high temperature; methods of initiating the curing reaction by eluting a curing agent of the molecular sieve sealed type at high temperature; methods of elution-curing with microcapsules; and the like. As latent curing agents of the thermally activated type, agents of the imidazole type, agents of the hydrazide type, boron trifluoride-amine complex compounds, sulfonium salts, amine imides, polyamine salts, dicyandiamides, or the like, or denatured versions of the above are available; and these may be used either singly or as mixtures or two of more thereof. Among these, latent curing agents of the microcapsule imidazole type are suitable.

While the abovementioned silane coupling agent is not particularly limited, for example, an epoxy type, an amino type, a mercapto-sulfide type, or a ureide type or the like may be suggested. By adding this silane coupling agent, the adherence at the interface between the organic material and the inorganic material is enhanced.

Electrically Conductive Particles

For the electrically conductive particles 4, any type of per se known electrically conductive particles used in the anisotropic conductive films 1 may be suggested. For example, particles made from various types of metal or metal alloy such as nickel, iron, copper, aluminum, tin, lead, chromium, cobalt, silver, gold, or the like, or particles made by coating the surfaces of particles made from metallic oxide, carbon, graphite, glass, ceramic, plastic or the like with such a metal, or particles made by further coating a thin electrically insulating layer upon the surfaces of such particles, or the like may be suggested as the electrically conductive particles 4. If the surfaces of the resin particles are to be coated with a metal, then particles made from, for example, epoxy resin, phenol resin, acrylic resin, acrylonitrile-styrene (AS) resin, benzoguanamine resin, divinylbenzene based resin, styrene based resin, or the like may be suggested as the resin particles. The size of the electrically conductive particles 4 is preferably from 1 to 10 μm, but the present invention is not to be considered as being limited thereto.

Regular Arrangement of Electrically Conductive Particles

Figure 6:
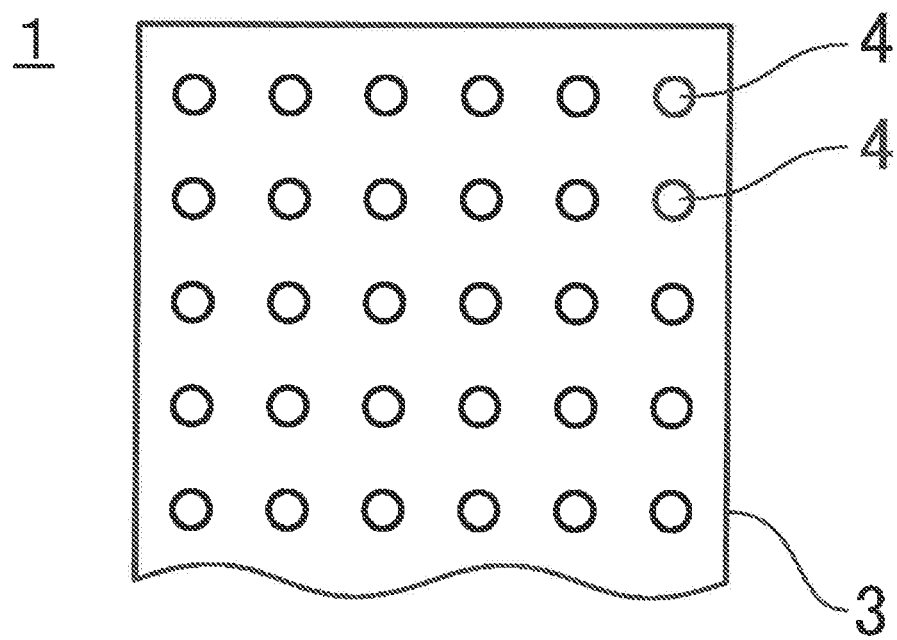
FIG. 6 is a plan view illustrating an anisotropic conductive film upon which electrically conductive particles are regularly arranged in the form of a lattice.

In the anisotropic conductive film 1, in plan view, the electrically conductive particles 4 are arranged regularly in a predetermined arrangement pattern, and are arranged in a lattice configuration, as for example illustrated in FIG. 6. As will be described hereinafter, by using such an anisotropic conductive film 1 in which the electrically conductive particles 4 are arranged regularly in plan view, the distance between the mutually opposing second output terminals 21b and second output bumps 25b that are arranged toward the outer sides of the mounting portion 27 of the transparent board 12 and of the mounting surface 18a of the liquid crystal drive IC 18 becomes within 130% with respect to the distance between the mutually opposing first output terminals 21a and the first output bumps 25a that are arranged toward the inner sides; and, as compared to the use of an anisotropic conductive film upon which electrically conductive particles 4 are randomly dispersed, the distance between the second output terminals 21b and second output bumps 25b that are arranged toward the outer sides is reduced, so that satisfactory electrical continuity can be obtained.

Furthermore, by the electrically conductive particles 4 being regularly arranged in plan view upon the anisotropic conductive film 1, as compared with the case in which they are randomly dispersed thereupon, the pitch of the spaces 35 between input and output bumps 23 and 25 that are adjacent upon the liquid crystal drive IC 18 are made finer so that the areas between the terminals can be narrowed down, also, even if the electrically conductive particles 4 are charged at high density, in the process of connecting the liquid crystal drive IC 18, it is possible to prevent short circuiting between the bumps over the spaces 35 between the input and output bumps 23 and 25, due to clumping of the electrically conductive particles 4.

Furthermore, by the electrically conductive particles 4 being arranged regularly upon the anisotropic conductive film 1, the occurrence of sparse or dense portions due to clumping of the electrically conductive particles 4 is prevented, even if the particles are charged into the binder resin layer 3 at high density. Accordingly, with this type of anisotropic conductive film 1, it is possible for the electrically conductive particles 4 to be appropriately captured, even in the case of input and output terminals 19 and 21 and input and output bumps 23 and 25 whose pitch has been made finer. The pattern in which the electrically conductive particles 4 are arranged may be set as desired.

This type of anisotropic conductive film 1 may, for example, be manufactured: by a method of applying adhesive upon a stretchable sheet, and, after having arranged the electrically conductive particles 4 thereupon in a single layer, stretching that sheet by a desired stretching magnification; by a method of, after having arranged the electrically conductive particles 4 upon a board in a predetermined arrangement pattern, transferring the electrically conductive particles 4 to the binder resin layer 3 that is supported upon the release film 2; by a method of supplying the electrically conductive particles 4 onto the binder resin layer 3 that is supported upon the release film 2 via an arrangement plate upon which opening portions are provided corresponding to an arrangement pattern, or the like.

It should be understood that the shape of the anisotropic conductive film 1 is not to be considered as being particularly limited; but for example, as illustrated in FIG. 5, it could be made in the shape of an elongated tape that can be wound up on a winding reel 6, so that just a predetermined length can be cut off to be used.

Furthermore while, in the embodiment described above, as the anisotropic conductive film 1, an example is described of an adhesion film for which a thermosetting resin composition in which the electrically conductive particles 4 are regularly arranged in the binder resin layer 3 is manufactured in the form of a film, the adhesive film according to the present invention is not limited by the above details; for example, it would be possible to build the film by layering an electrically insulating adhesive layer made only from the binder resin 3 and an electrically conductive particle containing layer made from the binder resin 3 in which the electrically conductive particles 4 are regularly arranged. Moreover, in the anisotropic conductive film 1, provided that the electrically conductive particles 4 are arranged in a regular arrangement in plan view, apart from a single layer arrangement as illustrated in FIG. 5, it would also be acceptable for the electrically conductive particles 4 to be arranged through a plurality of binder resin layers 3, and to be arranged regularly in plan view. Even further, in the anisotropic conductive film 1, it would also be acceptable for the particles to be dispersed individually at predetermined distances apart within at least one layer of a multilayered structure.

High Viscosity of Layer Containing Electrically Conductive Particles

Yet further, in a structure for this anisotropic conductive film 1 in which an electrically insulating adhesive layer made only from the binder resin 3 and an electrically conductive particle containing layer made from the binder resin 3 in which the electrically conductive particles 4 are regularly arranged are layered together, a viscosity of the electrically conductive particle containing layer may be greater than that of the electrically insulating adhesive layer.

By the electrically conductive particles 4 being regularly arranged in a binder resin 3 that has high viscosity, flowing of the binder resin 3 in the electrically conductive particle containing layer is suppressed even during heat application and pressurization by the thermocompression bonding head 33, and due to this, the occurrence of clumping of the electrically conductive particles 4, or bunching thereof into sparse and dense portions, is suppressed. Accordingly, with this liquid crystal drive IC 18 and this transparent board 12, the distances between the terminals and the bumps become satisfactory, not only for the terminal rows and bump rows toward the inner side, but also for the terminal rows and bump rows toward the outer side.

Process of Connection

Next, the connection process in which the liquid crystal drive IC 18 is connected to the transparent board 12 will be described. First, the anisotropic conductive film 1 is temporarily adhered upon the mounting portion 27 of the transparent board 12 on which the input and output terminals 19 and 21 are formed. Next, this transparent board 12 is mounted upon a stage of a connection device, and the liquid crystal drive IC 18 is disposed over the mounting portion 27 of the transparent board 12, interposed by the anisotropic conductive film 1.

Next, heat and pressure are applied to the liquid crystal drive IC 18 from above at a predetermined pressure level and for a predetermined time period by a thermocompression bonding head 33 heated to a predetermined temperature, so that the binder resin layer 3 is caused to harden. Due to this, the binder resin layer 3 of the anisotropic conductive film 1 becomes somewhat fluid and flows out between the mounting surface 18a of the liquid crystal drive IC 18 and the mounting portion 27 of the transparent board 12, also, the electrically conductive particles 4 in the binder resin layer 3 are sandwiched, pressed and squashed between the input and output bumps 23 and 25 of the liquid crystal drive IC 18 and the input and output terminals 19 and 21 of the transparent board 12.

As a result, electrical connection between the input and output bumps 23 and 25 and the input and output terminals 19 and 21 is established by the electrically conductive particles 4 being sandwiched between them, and in this state, the binder resin is hardened by application of heat by the thermocompression bonding head 33. Due to this, it is possible to manufacture the liquid crystal display panel 10 with which electrical continuity is ensured between the input and output bumps 23 and 25 of the liquid crystal drive IC 18 and the input and output terminals 19 and 21 formed on the transparent board 12. The pressure indentations by the electrically conductive particles 4 that are sandwiched between the input and output bumps 23 and 25 and the input and output terminals 19 and 21 appear as indentations within the input and output terminals 19 and 21, and can be observed from the rear surface of the transparent board 12, as illustrated in FIG. 2.

Those of the electrically conductive particles 4 that are not between the input and output bumps 23 and 25 and the input and output terminals 19 and 21 are dispersed in the binder resin in the spaces 35 between adjacent ones of the input and output bumps 23 and 25, and their state of mutual electrical insulation is maintained. Accordingly, in this liquid crystal display panel 10, electrical continuity is only set up between the input and output bumps 23 and 25 of the liquid crystal drive IC 18 and the input and output terminals 19 and 21 of the transparent board 12. Moreover, the anisotropic conductive film 1 is not limited to being of the thermal curing type; provided that pressurized connection is performed, an adhesive of the photocuring type or the photo-thermal dual curing type may be employed.

Distances Between Terminals and Bumps

Here, in this liquid crystal display panel 1, the distance between the second output terminals 21b and the second output bumps 25b that are arranged toward the outer sides of the mounting portion 27 of the transparent board 12 and of the mounting surface 18a of the liquid crystal drive IC 18 is greater than the distance between the first output terminals 21a and the first output bumps 25a that are arranged toward the inner sides thereof. This is because heat and pressure are applied by the thermocompression bonding head 33 while the crystal drive IC 18 is being connected to the transparent board 12, and elimination of the binder resin of the anisotropic conductive film 1 progresses in the region at the center where the input and output bumps 23 and 25 are not formed, and is due to the fact that warping occurs around the fulcrum constituted by the input bumps 23 and around the fulcrum constituted by the first output bumps 25a that are relatively disposed toward the inner sides of the mounting surface 18a. Moreover, at this time, if an anisotropic conductive film is employed in which the electrically conductive particles 4 are randomly dispersed, then the electrically conductive particles 4 are unevenly distributed, and the distance between a terminal and a bump may locally open up due to the particles clumping. Because of this, there is a fear that the electrically conductive particles 4 may not be sufficiently compressed between the second output terminals 21*b* and the second output bumps 25*b* that are arranged toward the outer sides, so that the electrical continuity may become poor.

In connection with this feature, in this liquid crystal display panel 1, since as described above the connection is established by using the anisotropic conductive film 1 upon which the electrically conductive particles 4 are arranged regularly in a predetermined arrangement pattern as seen in plan view, the distance between the second output terminals 21*b* and the second output bumps 25*b* that are arranged toward the outer sides of the mounting portion 27 of the transparent board 12 and of the mounting surface 18*a* of the liquid crystal drive IC 18 is not very much greater than the distance between the first output terminals 21*a* and the first output bumps 25*a* that are arranged toward the inner sides thereof, and is kept down to being within at most 130% thereof. Therefore, with this liquid crystal display panel 1, it is possible to ensure satisfactory electrical continuity between the second output terminals 21*b* and the second output bumps 25*b* that are arranged toward the outer sides as well as between the first output terminals 21*a* and the first output bumps 25*a* that are arranged toward the inner sides.

The distances between the first and second output terminals 21*a* and 21*b* and the first and second output bumps 25*a* and 25*b* may be ascertained by, after having connected the liquid crystal drive IC 18, making a section thereof at a spot at which a first and a second output bump 25*a* and 25*b* are connected, and by measuring the distances between the first output terminal 21*a* and the first output bump 25*a*, and between the second output terminal 21*b* and the second output bump 25*b*, that are exposed by this sectional surface.

Furthermore, by comparing the distance between the input and output terminals 19 and 21 and the input and output bumps 23 and 25 as a ratio with respect to the average particle diameter of the electrically conductive particles 4 contained in the anisotropic conductive film 1, it is possible to check that the necessary distance has been provided for obtaining satisfactory electrical continuity due to squashing of the electrically conductive particles 4, irrespective of the particle diameter of the electrically conductive particles 4 that are used. Due to this, in this specification, the distances between the input and output terminals 19 and 21 and the input and output bumps 23 and 25 will be described in terms of their ratios (%) to the average particle diameter of the electrically conductive particles.

Center in the Widthwise Direction

In this liquid crystal display panel 1, at the center portion of the output bump row 26 in which the output bumps 25 of the liquid crystal drive IC 18 are arranged, the distance between the mutually opposing second output terminal 21*b* and second output bump 25*b* that are arranged toward the outer side is preferably within 130% of the distance between the mutually opposing first output terminal 21*a* and first output bump 25*a* that are arranged toward the inner side. The center portion of the output bump row 26 of the liquid crystal drive IC 18 is the portion that is most separated from the corner portions of the heated and pressurized surface of the thermocompression bonding head 33, and is the location in the second output bump row 26*b* where the relative warping is the greatest.

Accordingly, at the center portion of that output bump row 26, it may be considered that satisfactory electrical continuity is implemented by squashing the electrically conductive particles 4, because all the distances between each input and output terminal 19 and 21 and input and output bump 23 and 25 becomes within 130%, due to the fact that the distance between the mutually opposing second output terminal 21*b* and second output bump 25*b* that are arranged toward the outer side becomes within 130% of the distance between the mutually opposing first output terminal 21*a* and first output bump 25*a* that are arranged toward the inner side.

Comparison between Both Ends in Arrangement Direction

Furthermore, with this liquid crystal display panel 1, when the ratio of the distance $D_o$ between the second output terminals 21*b* and the second output bumps 25*b* that are arranged toward the outer sides of the transparent board 12 and the liquid crystal drive IC 18, to the distance $D_i$ between the first output terminals 21*a* and the first output bumps 25*a* that are arranged toward the inner sides of the transparent board 12 and the liquid crystal drive IC 18 is termed D ($=D_o/D_i$), D is preferably 130% of the ratio d ($=d_o/d_i$) of the average distance $d_o$ between the mutually opposing second output terminals 21*b* and the second output bumps 25*b* that are arranged toward the outer sides of the transparent board 12 and the liquid crystal drive IC 18 to the average distance $d_i$ between the mutually opposing first output terminals 21*a* and the first output bumps 25*a* that are arranged toward the inner sides thereof at both ends in the direction in which the output bumps 25 of the liquid crystal drive IC 18 are arranged.

The warping of the output bumps 25 of the liquid crystal drive IC 18 at the both end portions in the direction in which they are arranged is comparatively small, so that the ratio d ($=d_o/d_i$) of the average distance $d_o$ between the mutually opposing second output terminals 21*b* and the second output bumps 25*b* arranged toward the outer sides of the transparent board 12 and the liquid crystal drive IC 18, to the average distance $d_i$ between the mutually opposing first output terminals 21*a* and the first output bumps 25*a* arranged toward the inner sides thereof is almost equal, so that satisfactory electrical continuity is obtained at both the inner and outer regions. Accordingly, due to the ratio D of the distances between the first and second output terminals 21*a* and 21*b* and the first and second output bumps 25*a* and 25*b* which are each arranged toward the outer side and toward the inner side being within 130% of the ratio d described above at both end portions in the direction in which the output bumps 25 are arranged, it is considered that the first and second output terminals 21*a* and 21*b* and first and second output bumps 25*a* and 25*b* have satisfactory electrical continuity, in a similar manner to the case with the first output terminals 21*a* and the first output bumps 25*a*, and the second output terminals 21*b* and the second output bumps 25*b*, at the both end portions in the direction in which the output bumps 25 are arranged.

Center in the Widthwise Direction

In this liquid crystal display panel 1, the ratio D ($=D_o/D_i$) of the distance $D_o$ between the second output terminals 21*b* and the second output bumps 25*b* at the center portion of the output bump row 26 in which the output bumps 25 of the liquid crystal drive IC 18 are arranged to the distance $D_i$ between the first output terminals 21*a* and the first output bumps 25*a* that are arranged toward the inner sides of the transparent board 12 and the liquid crystal drive IC 18 is preferably within 130% of the above described ratio d at both end portions in the direction in which the output bumps 25 are arranged. As described above, the center portion of the output bump row 26 in which the output bumps 25 of the liquid crystal drive IC 18 are arranged is the location that is most separated from the corner portions of the heating and pressurizing surface of the thermocompression bonding head 33, and at which the warping is relatively greatest at the second bump row 26b.

Accordingly, at the center portion of that output bump row 26, due to the ratio D (=$D_o/D_i$) of the distance $D_o$ between the second output terminals 21b and the second output bumps 25b to the distance $D_i$ between the first output terminals 21a and the first output bumps 25a that are arranged toward the inner sides of the transparent board 12 and the liquid crystal drive IC 18 being within 130% of the ratio d described above at both end portions in the direction in which the output bumps 25 are arranged, it is considered that all of the first and second output terminals 21a and 21b and the first and second output bumps 25a and 25b have satisfactory electrical continuity, in a similar manner to the case with the first output terminals 21a and the first output bumps 25a, and the second output terminals 21b and the second output bumps 25b, at the both end portions in the direction in which the output bumps 25 are arranged.

Average Distance at both End Portions of Input and Output Bump Rows

Furthermore, with this liquid crystal display panel 1, the distance $D_o$ between the mutually opposing second output terminals 21b and second output bumps 25b that are arranged toward the outer side in the second terminal region 27b of the transparent board 12 and the second bump region 18c of the liquid crystal drive IC 18 is preferably within 110% of the distance $d_{AVE}$, which is the average of the distance between the mutually opposing second output terminals 21b and second output bumps 25b at both end portions of the second output terminal row 22b and the second output bump row 26b that are arranged toward the outer sides of the second terminal region 27b of the transparent board 12 and the second bump region 18c of the liquid crystal drive IC 18, and the distance between the mutually opposing input terminals 19 and input bumps 23 at both end portions of the input terminal row 20 and the input bump row 24 in the first terminal region 27a of the transparent board 12 and the first bump region 18b of the liquid crystal drive IC 18.

In the case where a plurality of input terminal rows 20 and input bump rows 24 are present in parallel in the widthwise direction orthogonal to the direction in which the input terminals 19 and input bumps 23 are arranged, the phrase "both end portions of the input terminal row 20 and the input bump row 24" means both end portions of that input terminal row 20 and that input bump row 24 that are arranged toward the outer side.

At both end portions of the input and output bumps 23 and 25 of the liquid crystal drive IC 18 in the direction in which they are arranged, the warping due to the pressure experienced from the thermocompression bonding head 33 is comparatively small, and the distances at all four points, i.e. the distances between the mutually opposing input terminals 19 and input bumps 23 at both end portions of the input terminal row 20 that are arranged toward the outer side of the transparent board 12 and the liquid crystal drive IC 18, and the distances between the mutually opposing second output terminals 21b and second output bumps 25b at both end portions of the second output terminal row 22b, are substantially equal, so that satisfactory electrical continuity is obtained.

Therefore, due to the fact that the distance $D_o$ between the mutually opposing second output terminals 21b and second output bumps 25b that are arranged toward the outer side in the second terminal region 27b of the transparent board 12 and the second bump region 18c of the liquid crystal drive IC 18 is within 110% of the distance $d_{AVE}$ that is the average of the distances at all the four points, i.e. of the distances between the mutually opposing input terminals 19 and input bumps 23 at both end portions of the input terminal row 20 and the input bump row 24, and of the distances between the second output terminals 21b and the second output bumps 25b at both end portions of the second output terminal row 22b and the second output bump row 26b, satisfactory electric conductivity is provided between the abovementioned second output terminal 21b and second output bump 25b, in a similar manner to the case with the input terminals 19 and input bumps 23 and the second output terminals 21b and second output bumps 25b at both end portions of the input terminal row 20 and the input bump row 24, and of the second output terminal row 22b and the second output bump row 26b.

Center in the Widthwise Direction

In this liquid crystal display panel 1, the distance $D_o$ between the second output terminals 21b and second output bumps 25b at the center portion of the output bump row 26 in which the output bumps 25 of the liquid crystal drive IC 18 are arranged is preferably within 110% of the distance $d_{AVE}$ that is the average of the distances at all the four points, i.e. of the distances between the mutually opposing input terminals 19 and input bumps 23 at both end portions of the input terminal row 20 and the input bump row 24, and of the distances between the second output terminals 21b and the second output bumps 25b at both end portions of the second output terminal row 22b and the second output bump row 26b. As described above, the center portion of the output bump row 26 in which the output bumps 25 of the liquid crystal drive IC 18 are arranged is the location that is most separated from the corner portions of the heating and pressurizing surface of the thermocompression bonding head 33, and at which the warping is relatively greatest at the second output bump row 26b.

Accordingly it is considered that, by keeping the distance $D_o$ between the second output terminals 21b and the second output bumps 25b at the center portion of the abovementioned output bump row 26 within 110% of the average distance $d_{AVE}$ described above, satisfactory electrical continuity is provided between all of the second output terminals 21b and the second output bumps 25b, in a similar manner to the case with the mutually opposing input terminals 19 and input bumps 23 at both end portions of the input terminal row 20 and the input bump row 24, and with the second output terminals 21b and the second output bumps 25b at both end portions of the second output terminal row 22b and the second output bump row 26b.

Figure 9A:
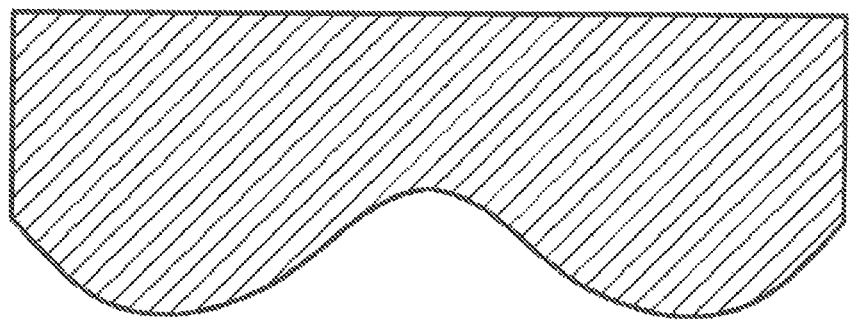
FIGS. 9A to 9C are sectional views in which only bumps are illustrated, the bumps being formed with concave and convex portions.
Figure 9B:
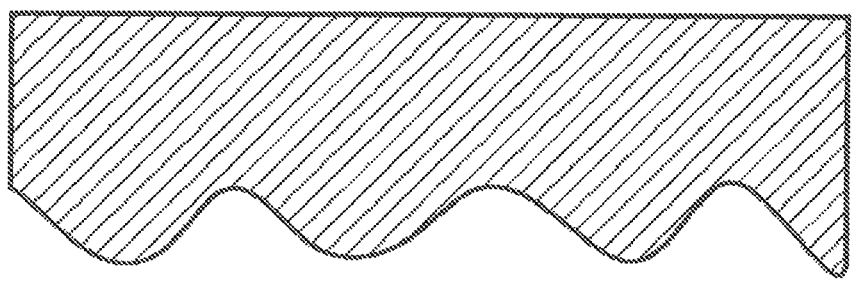
Figure 9C:
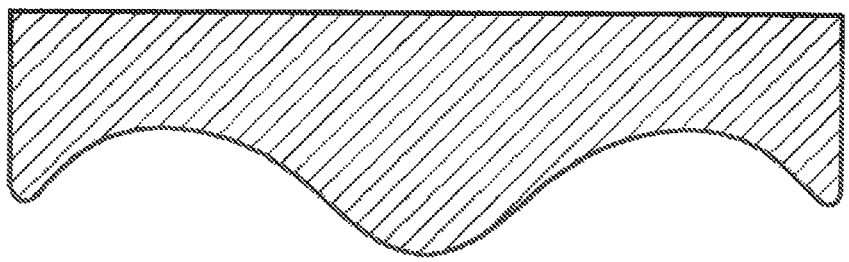
Figure 10A:
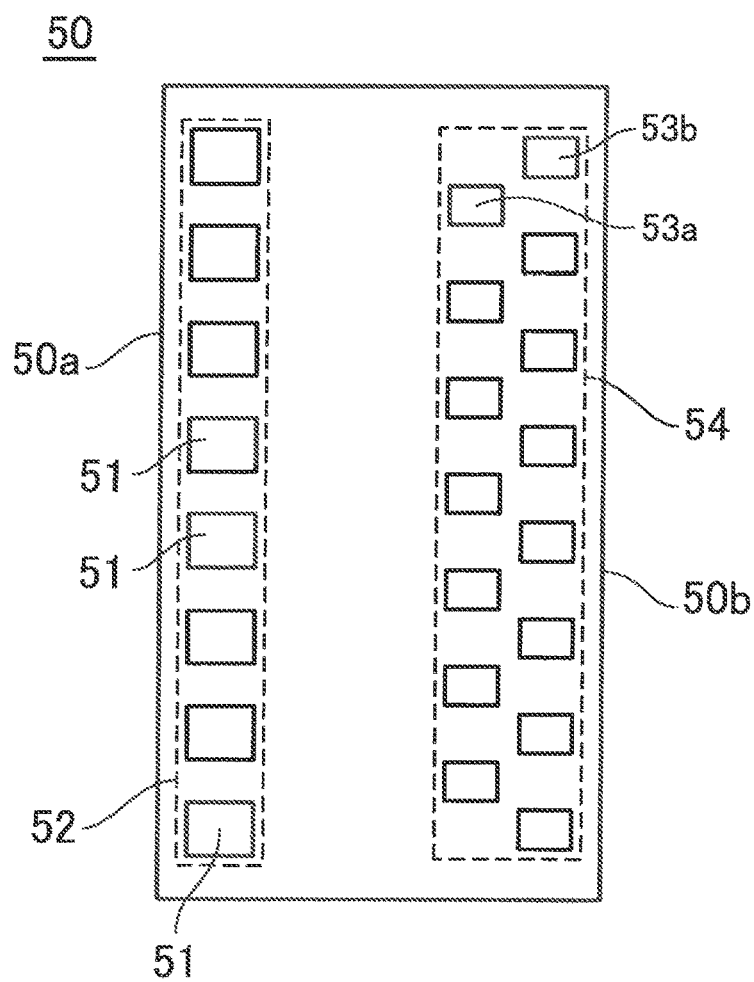
FIG. 10A is a plan view of a liquid crystal drive IC.
Figure 10B:
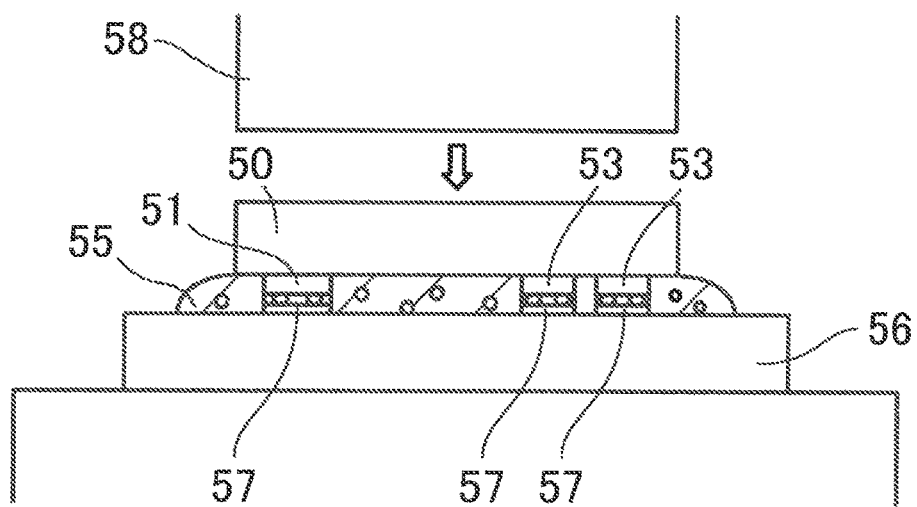
FIG. 10B is a sectional view illustrating a connection process.
Figure 11:
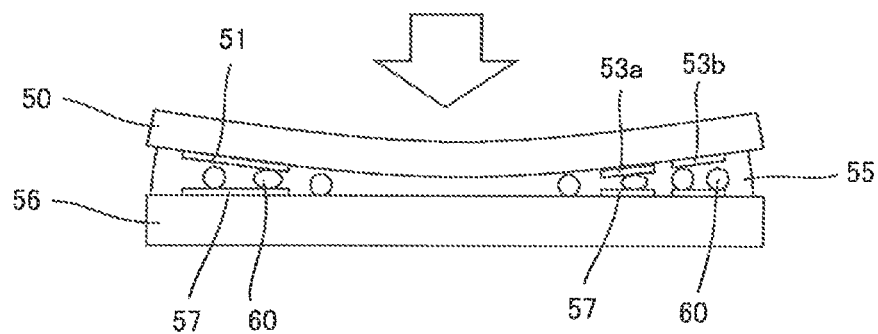
FIG. 11 is a sectional view illustrating a situation in which bending of a liquid crystal drive IC has taken place.

Here, in some cases, concave and convex shapes may be formed upon the bump surfaces of the bumps of the IC. For example, the bump surfaces may have shapes of various kinds, such as shapes in which the centers are concaved (FIG. 9A), shapes in which concavities and convexities are repeated (FIG. 9B), or shapes in which the centers are convexed (FIG. 9C). Moreover, the concavities and convexities formed upon the bump surfaces could be shaped in various ways, such as to extend along the widthwise direction of the bumps, or to extend along the longitudinal direction of the bumps. Apart from the above, the concave and convex shapes may be formed only upon portions of the bump surfaces. Furthermore, there are also various possibilities for the difference in elevation between the concavities and convexities, and for their area proportions.

According to the present invention, even in the case of bumps such as those described above whose surfaces are not smoothed, the capability of the input and output bumps for capturing particles is made to be greater than some particular level, and accordingly it is possible to provide satisfactory electrical continuity. In concrete terms it is considered that, even if warping such as described above takes place, still it is possible to obtain sufficient efficiency for particle capture, provided that the maximum difference in elevation between the concavities and the convexities is within 50% of the electrically conductive particle diameter.

EXAMPLES

First Example

Next, Examples of the present invention will be describe. In a first Example, using an anisotropic conductive film upon which electrically conductive particles were regularly arranged, and also an anisotropic conductive film upon which electrically conductive particle were randomly dispersed, connection body samples were manufactured in which evaluation ICs were connected to glass boards for evaluation. The ratios of the distances between the terminals and the bumps to the average particle diameters of the electrically conductive particles by sectional inspection, and the ratios of the distances between the terminals and the bumps in the terminal rows toward the outer sides of the evaluation ICs with respect to the distances between the terminals and the bumps in the terminal rows toward their inner sides were obtained. Moreover, for each connection body sample, its initial electrical conduction resistance, its electrical conduction resistance after a reliability test, and its ratio of occurrence of short circuiting between adjacent IC bumps were measured.

Anisotropic Conductive Film

The binder resin layer of the anisotropic conductive film that was used for connection of the evaluation ICs was manufactured by adding 60 parts by mass of a phenoxy resin (trade name: YP 50, manufactured by NIPPON STEEL & SUMIKIN CHEMICAL CO., LTD), 40 parts by mass of an epoxy resin (trade name: jER 828, manufactured by Mitsubishi Chemical Corporation), and 2 parts by mass of a cationic curing agent (trade name: SI-60 L, manufactured by SANSHIN CHEMICAL INDUSTRY CO., LTD) to a solvent, so as to adjust a binder resin composition, and by applying this binder resin composition upon a release film and drying it.

Evaluation ICs for Sectional Inspection and Electrical Conduction Resistance Measurement As evaluation elements for sectional inspection and for measuring electrical conduction resistance, three types having external dimensions 1.0 mm×20 mm, 1.5 mm×20 mm, and 2.0 mm×20 mm were prepared. Each of these evaluation elements was formed to have thickness 0.2 mm, and to have bumps (Au-plated) of width 15 μm, length 100 μm, and height 12 μm.

Evaluation ICs for Measuring Short Circuiting between IC Bumps

As evaluation elements for measuring short circuiting between the IC bumps, evaluation ICs were used having an external shape 0.7 mm×20 mm and thickness 0.2 mm, and having bumps (Au-plated) of width 15μ, length 100 μm, and height 12 μm, with the width of the spaces between the bumps being 7.5 μm.

Bump Arrangement

Figure 7:
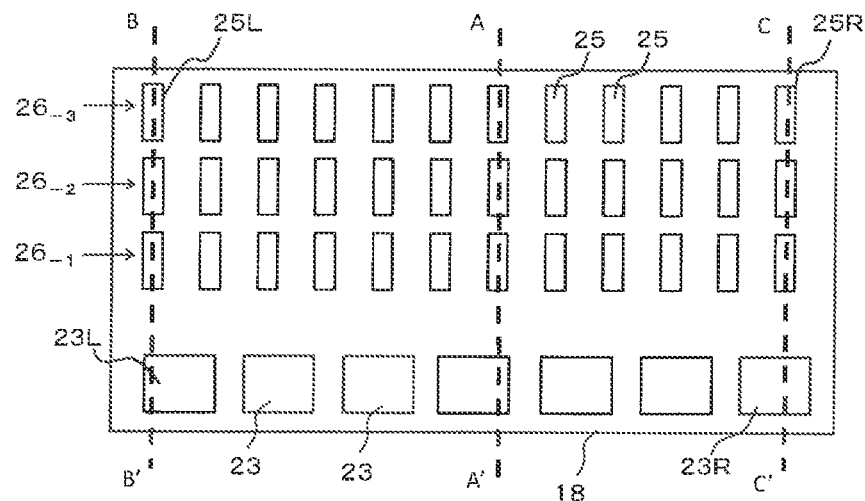
FIG. 7 is a plan view illustrating positions for measurement of distances between bumps of an evaluation IC and terminals, according to an Example.
Figure 8:
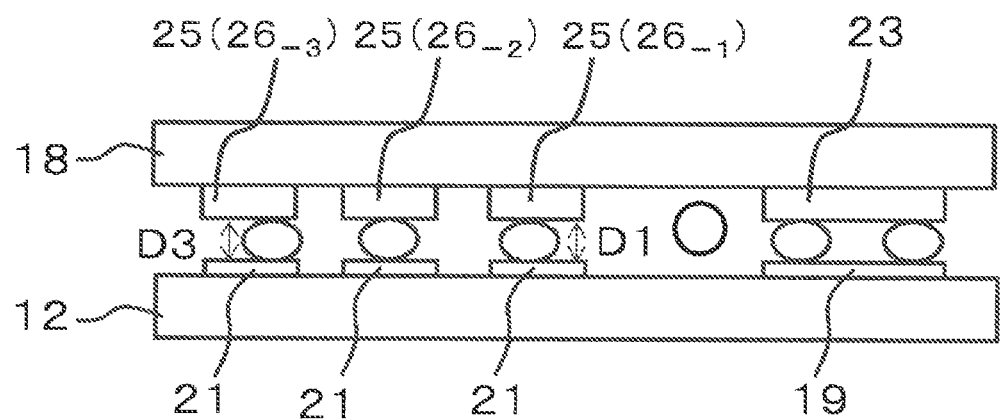
FIG. 8 is a sectional view illustrating positions for measurement of distances between bumps of an evaluation IC and terminals, according to an Example.

As illustrated in FIGS. 7 and 8, the evaluation ICs 18 were formed in substantially rectangular shapes, and moreover were provided with input and output bump rows 24 and 26 in which a plurality of input and output bumps 23, 25 are arranged along the longitudinal direction. An input bump row 24 was formed as a row along one side edge of each of the evaluation ICs. Three output bump rows 26 were formed along the other side edge of each of the evaluation ICs. In other words, on each of the evaluation ICs 18, three output bump rows $26_{-1}$, $26_{-2}$, and $26_{-3}$ were formed so as to lie parallel to one another in the widthwise direction, with a plurality of output bumps 25 being arranged in each of these output bump rows along the longitudinal direction of the evaluation IC. Here, the output bump row $26_{-1}$ that was disposed most inward on the evaluation IC 18 is termed the first row, the output bump row $26_{-3}$ that was disposed most outward on the evaluation IC 18 is termed the third row, and the output bump row $26_{-2}$ that was disposed in the center is termed the second row.

Glass Boards for Evaluation

As glass boards 12 for evaluation to each of which an evaluation IC for sectional inspection and measurement of electrical conduction resistance and an evaluation IC for measurement of short circuiting between the IC bumps were to be connected, a piece of ITO patterned glass having external shape 30 mm×50 mm and thickness 0.5 mm was used, upon which terminal rows were formed in which a plurality of input and output terminals 19, 21 were arranged. The plurality of input and output terminals 19, 21 had the same size and the same pitch as the bumps of the evaluation ICs 18 for sectional inspection and electrical conduction resistance measurement and were made from ITO wiring.

After having temporarily adhered the anisotropic conductive film upon this glass board 12 for evaluation, the evaluation ICs 18 were mounted thereupon while establishing alignment between the IC bumps and the board electrodes, and connection body samples were then produced by thermocompression bonding using a thermocompression bonding head for 5 seconds at 180° C. and 80 MPa. For each of these connection body samples, the initial electrical conduction resistance, the electrical conduction resistance after reliability testing, and the ratio of occurrence of short circuiting between adjacent IC bumps were measured. The reliability testing was performed over 500 hours while keeping the connection body sample in a thermostatic oven at a temperature of 85° C. and at a humidity of 85% RH.

Moreover, the ratio of occurrence of short circuiting between the IC bumps was evaluated as being excellent (A) when less than 300 ppm, as being satisfactory (B) when greater than or equal to 300 ppm and less than 1000 ppm, and as being poor (C) when greater than or equal to 1000 ppm.

Example 1

In Example 1, an anisotropic conductive film was used on which the electrically conductive particles were arranged regularly in the binder resin layer. For manufacturing the anisotropic conductive film used in this Example 1, an adhesive was applied upon a stretchable sheet, and, after having arranged electrically conductive particles evenly in a single layer arrangement thereupon in a lattice configuration, in a state in which this sheet was stretched by a predetermined stretching magnification, a binder resin layer was laminated thereupon. The electrically conductive particles that were used (trade name: AUL704, manufactured by SEKISUI CHEMICAL CO., LTD.) had particle diameter of 4 μm, and the number density of particles that was employed was 28000/mm$^2$.

With this connection body sample according to Example 1, the initial electrical conduction resistance was 0.2Ω and the electrical conduction resistance after the reliability test was 2.4Ω. Moreover, the ratio of occurrence of short circuiting between the IC bumps was less than 300 ppm (A).

Example 2

In Example 2, the conditions were the same as in Example 1, apart from the use of an anisotropic conductive film upon which the number density of particles was 5200/mm².

With the connection body sample according to this Example 2, the initial electrical conduction resistance was 0.4Ω and the electrical conduction resistance after the reliability test was 3.4Ω. Moreover, the ratio of occurrence of short circuiting between the IC bumps was less than 300 ppm (A).

Example 3

In Example 3, the conditions were the same as in Example 1, apart from the use of an anisotropic conductive film upon which electrically conductive particles (trade name: AUL703, manufactured by SEKISUI CHEMICAL CO., LTD.) having particle diameter of 3 μm were arranged regularly at a number density of particles of 50000/mm².

With the connection body sample according to this Example 3, the initial electrical conduction resistance was 0.2Ω and the electrical conduction resistance after the reliability test was 2.5Ω. Moreover, the ratio of occurrence of short circuiting between the IC bumps was less than 300 ppm (A).

Example 4

In Example 4, the conditions were the same as in Example 1, apart from the use of an anisotropic conductive film upon which electrically conductive particles (trade name: AUL705, manufactured by SEKISUI CHEMICAL CO., LTD.) having particle diameter of 5 μm were arranged regularly at a number density of particles of 18000/mm².

With the connection body sample according to this Example 4, the initial electrical conduction resistance was 0.2Ω and the electrical conduction resistance after the reliability test was 3.0Ω. Moreover, the ratio of occurrence of short circuiting between the IC bumps was greater than or equal to 300 ppm and less than 1000 ppm (B).

Comparative Example 1

In Comparative Example 1, an anisotropic conductive film was used in which the electrically conductive particles were randomly dispersed in the binder resin layer by adding the electrically conductive particles to the binder resin composition to be adjusted, and by applying this composition upon the release film and firing it. The electrically conductive particles that were used (trade name: AUL704, manufactured by SEKISUI CHEMICAL CO., LTD.) had particle diameter of 4 μm, and the number density of particles was 60000/mm².

With the connection body sample according to this Comparative Example 1, the initial electrical conduction resistance was 0.2Ω and the electrical conduction resistance after the reliability test was 2.8Ω. Moreover, the ratio of occurrence of short circuiting between the IC bumps was greater than or equal to 1000 ppm (C).

TABLE 1

| | | | Example 1 | Example 2 | Example 3 | Example 4 | Comparative Example 1 |
|---|---|---|---|---|---|---|---|
| | | number density of particles (per mm²) | 28000 | 5200 | 50000 | 18000 | 60000 |
| | | electrically conductive particle diameter (μm) | 4 | 4 | 3 | 5 | 4 |
| | | whether or not regularly arranged | regularly arranged | regularly arranged | regularly arranged | regularly arranged | randomly arranged |
| | | initial electrical conduction resistance (Ω) | 0.2 | 0.4 | 0.2 | 0.2 | 0.2 |
| | | electrical conduction resistance after reliability testing (Ω) | 2.4 | 3.4 | 2.5 | 3.0 | 2.8 |
| | | short circuiting (ppm) | A | A | A | B | C |
| IC (1 × 20 mm) | first row | number of captured particles | 37 | 6 | 61 | 24 | 27 |
| | | distance D1 between bumps and terminals (%) | 62 | 57 | 69 | 55 | 58 |
| | third row | number of captured particles | 35 | 6 | 58 | 23 | 7 |
| | | distance D3 between bumps and terminals (%) | 64 | 62 | 70 | 57 | 84 |
| | | D(=D3/D1) | 1.03 | 1.09 | 1.01 | 1.04 | 1.45 |
| IC (1.5 × 20 mm) | first row | number of captured particles | 36 | 7 | 60 | 23 | 29 |
| | | distance D1 between bumps and terminals (%) | 61 | 56 | 68 | 54 | 54 |
| | third row | number of captured particles | 34 | 6 | 55 | 22 | 4 |
| | | distance D3 between bumps and terminals (%) | 65 | 64 | 74 | 57 | 95 |
| | | D(=D3/D1) | 1.07 | 1.14 | 1.09 | 1.06 | 1.76 |
| IC (2 × 20 mm) | first row | number of captured particles | 36 | 6 | 63 | 23 | 25 |
| | | distance D1 between bumps and terminals (%) | 60 | 55 | 68 | 55 | 51 |
| | third row | number of captured particles | 32 | 5 | 52 | 21 | 2 |
| | | distance D3 between bumps and terminals (%) | 67 | 69 | 80 | 59 | 108 |
| | | D(=D3/D1) | 1.12 | 1.25 | 1.18 | 1.07 | 2.12 |

In this first Example, with the connection body samples according to Examples 1 to 4 and Comparative Example 1, the central portions of the input and output bump rows 24, 26 were sectioned in the widthwise direction of the evaluation ICs 18, as illustrated by A-A' in FIG. 7, and the resulting sections were inspected. And, as illustrated in FIG. 8, the distances D1 and D3 between the output terminals 21 and the output bumps 25 at the central portions of the first and third output bump rows $26_{-1}$ and $26_{-3}$ were obtained respectively as ratios to the particle diameter of the electrically conductive particles, and the ratio D (=D3/D1) of the distance D3 at the central portion of the third output bump row $26_{-3}$ to the distance D1 at the central portion of the first output bump row $26_{-1}$ was calculated. Moreover, the numbers of electrically conductive particles captured between the output terminals 21 and the output bumps 25 at the central portions of the first and the third output bump rows $26_1$ and $26_3$ were counted.

Results of Example 1

With Example 1 when the evaluation IC (1×20 mm) was used, the distance D1 between the output terminals 21 and the output bumps 25 at the central portion of the first output bump row $26_{-1}$ was 62% of the electrically conductive particle diameter (4 µm), with the number of captured particles being 37; and the distance D3 between the output terminals 21 and the output bumps 25 at the central portion of the third output bump row $26_{-3}$ was 64% of the electrically conductive particle diameter (4 µm), with the number of captured particles being 35. The ratio D (=D3/D1) of the distance D3 between the output terminals 21 and the output bumps 25 in the third row with respect to the distance D1 between the output terminals 21 and the output bumps 25 in the first row was 1.03.

With Example 1 when the evaluation IC (1.5×20 mm) was used, the distance D1 between the output terminals 21 and the output bumps 25 at the central portion of the first output bump row $26_{-1}$ was 61% of the electrically conductive particle diameter (4 µm), with the number of captured particles being 36; and the distance D3 between the output terminals 21 and the output bumps 25 at the central portion of the third output bump row $26_{-3}$ was 65% of the electrically conductive particle diameter (4 µm), with the number of captured particles being 34. The ratio D (=D3/D1) of the distance D3 between the output terminals 21 and the output bumps 25 in the third row with respect to the distance D1 between the output terminals 21 and the output bumps 25 in the first row was 1.07.

With Example 1 when the evaluation IC (2×20 mm) was used, the distance D1 between the output terminals 21 and the output bumps 25 at the central portion of the first output bump row $26_{-1}$ was 60% of the electrically conductive particle diameter (4 µm), with the number of captured particles being 36; and the distance D3 between the output terminals 21 and the output bumps 25 at the central portion of the third output bump row $26_{-3}$ was 67% of the electrically conductive particle diameter (4 µm), with the number of captured particles being 32. The ratio D (=D3/D1) of the distance D3 between the output terminals 21 and the output bumps 25 in the third row with respect to the distance D1 between the output terminals 21 and the output bumps 25 in the first row was 1.12.

Results of Example 2

With Example 2 when the evaluation IC (1×20 mm) was used, the distance D1 between the output terminals 21 and the output bumps 25 at the central portion of the first output bump row $26_{-1}$ was 57% of the electrically conductive particle diameter (4 µm), with the number of captured particles being 6; and the distance D3 between the output terminals 21 and the output bumps 25 at the central portion of the third output bump row $26_{-3}$ was 62% of the electrically conductive particle diameter (4 µm), with the number of captured particles being 6. The ratio D (=D3/D1) of the distance D3 between the output terminals 21 and the output bumps 25 in the third row with respect to the distance D1 between the output terminals 21 and the output bumps 25 in the first row was 1.09.

With Example 2 when the evaluation IC (1.5×20 mm) was used, the distance D1 between the output terminals 21 and the output bumps 25 at the central portion of the first output bump row $26_{-1}$ was 56% of the electrically conductive particle diameter (4 µm), with the number of captured particles being 7; and the distance D3 between the output terminals 21 and the output bumps 25 at the central portion of the third output bump row $26_{-3}$ was 64% of the electrically conductive particle diameter (4 µm), with the number of captured particles being 6. The ratio D (=D3/D1) of the distance D3 between the output terminals 21 and the output bumps 25 in the third row with respect to the distance D1 between the output terminals 21 and the output bumps 25 in the first row was 1.14.

With Example 2 when the evaluation IC (2×20 mm) was used, the distance D1 between the output terminals 21 and the output bumps 25 at the central portion of the first output bump row $26_{-1}$ was 55% of the electrically conductive particle diameter (4 µm), with the number of captured particles being 6; and the distance D3 between the output terminals 21 and the output bumps 25 at the central portion of the third output bump row $26_{-3}$ was 69% of the electrically conductive particle diameter (4 µm), with the number of captured particles being 5. The ratio D (=D3/D1) of the distance D3 between the output terminals 21 and the output bumps 25 in the third row with respect to the distance D1 between the output terminals 21 and the output bumps 25 in the first row was 1.25.

Results of Example 3

With Example 3 when the evaluation IC (1×20 mm) was used, the distance D1 between the output terminals 21 and the output bumps 25 at the central portion of the first output bump row $26_{-1}$ was 69% of the electrically conductive particle diameter (3 µm), with the number of captured particles being 61; and the distance D3 between the output terminals 21 and the output bumps 25 at the central portion of the third output bump row $26_{-3}$ was 70% of the electrically conductive particle diameter (3 µm), with the number of captured particles being 58. The ratio D (=D3/D1) of the distance D3 between the output terminals 21 and the output bumps 25 in the third row with respect to the distance D1 between the output terminals 21 and the output bumps 25 in the first row was 1.01.

With Example 3 when the evaluation IC (1.5×20 mm) was used, the distance D1 between the output terminals 21 and the output bumps 25 at the central portion of the first output bump row $26_{-1}$ was 68% of the electrically conductive particle diameter (3 µm), with the number of captured particles being 60; and the distance D3 between the output terminals 21 and the output bumps 25 at the central portion of the third output bump row $26_{-3}$ was 74% of the electrically conductive particle diameter (3 µm), with the number of captured particles being 55. The ratio D (=D3/D1) of the distance D3 between the output terminals 21 and the output bumps 25 in the third row with respect to the distance D1 between the output terminals 21 and the output bumps 25 in the first row was 1.09.

With Example 3 when the evaluation IC (2×20 mm) was used, the distance D1 between the output terminals 21 and the output bumps 25 at the central portion of the first output bump row $26_{-1}$ was 68% of the electrically conductive particle diameter (3 μm), with the number of captured particles being 63; and the distance D3 between the output terminals 21 and the output bumps 25 at the central portion of the third output bump row $26_{-3}$ was 80% of the electrically conductive particle diameter (3 μm), with the number of captured particles being 52. The ratio D (=D3/D1) of the distance D3 between the output terminals 21 and the output bumps 25 in the third row with respect to the distance D1 between the output terminals 21 and the output bumps 25 in the first row was 1.18.

Results of Example 4

With Example 4 when the evaluation IC (1×20 mm) was used, the distance D1 between the output terminals 21 and the output bumps 25 at the central portion of the first output bump row $26_{-1}$ was 55% of the electrically conductive particle diameter (5 μm), with the number of captured particles being 24; and the distance D3 between the output terminals 21 and the output bumps 25 at the central portion of the third output bump row $26_{-3}$ was 57% of the electrically conductive particle diameter (5 μm), with the number of captured particles being 23. The ratio D (=D3/D1) of the distance D3 between the output terminals 21 and the output bumps 25 in the third row with respect to the distance D1 between the output terminals 21 and the output bumps 25 in the first row was 1.04.

With Example 4 when the evaluation IC (1.5×20 mm) was used, the distance D1 between the output terminals 21 and the output bumps 25 at the central portion of the first output bump row $26_{-1}$ was 54% of the electrically conductive particle diameter (5 μm), with the number of captured particles being 23; and the distance D3 between the output terminals 21 and the output bumps 25 at the central portion of the third output bump row $26_{-3}$ was 57% of the electrically conductive particle diameter (5 μm), with the number of captured particles being 22. The ratio D (=D3/D1) of the distance D3 between the output terminals 21 and the output bumps 25 in the third row with respect to the distance D between the output terminals 21 and the output bumps 25 in the first row was 1.06.

With Example 4 when the evaluation IC (2×20 mm) was used, the distance D1 between the output terminals 21 and the output bumps 25 at the central portion of the first output bump row $26_{-1}$ was 55% of the electrically conductive particle diameter (5 μm), with the number of captured particles being 23; and the distance D3 between the output terminals 21 and the output bumps 25 at the central portion of the third output bump row $26_{-3}$ was 59% of the electrically conductive particle diameter (5 μm), with the number of captured particles being 21. The ratio D (=D3/D1) of the distance D3 between the output terminals 21 and the output bumps 25 in the third row with respect to the distance D1 between the output terminals 21 and the output bumps 25 in the first row was 1.07.

Results of Comparative Example 1

With Comparative Example 1 when the evaluation IC (1×20 mm) was used, the distance D1 between the output terminals 21 and the output bumps 25 at the central portion of the first output bump row $26_{-1}$ was 58% of the electrically conductive particle diameter (4 μm), with the number of captured particles being 27; and the distance D3 between the output terminals 21 and the output bumps 25 at the central portion of the third output bump row $26_{-3}$ was 84% of the electrically conductive particle diameter (4 μm), with the number of captured particles being 7. The ratio D (=D3/D1) of the distance D3 between the output terminals 21 and the output bumps 25 in the third row with respect to the distance D11 between the output terminals 21 and the output bumps 25 in the first row was 1.45.

With Comparative Example 1 when the evaluation IC (1.5×20 mm) was used, the distance D1 between the output terminals 21 and the output bumps 25 at the central portion of the first output bump row $26_{-1}$ was 54% of the electrically conductive particle diameter (4 μm), with the number of captured particles being 29; and the distance D3 between the output terminals 21 and the output bumps 25 at the central portion of the third output bump row $26_{-3}$ was 95% of the electrically conductive particle diameter (4 μm), with the number of captured particles being 4. The ratio D (=D3/D1) of the distance D3 between the output terminals 21 and the output bumps 25 in the third row with respect to the distance D1 between the output terminals 21 and the output bumps 25 in the first row was 1.76.

With Comparative Example 1 when the evaluation IC (2×20 mm) was used, the distance D1 between the output terminals 21 and the output bumps 25 at the central portion of the first output bump row $26_{-1}$ was 51% of the electrically conductive particle diameter (4 μm), with the number of captured particles being 25; and the distance D3 between the output terminals 21 and the output bumps 25 at the central portion of the third output bump row $26_{-3}$ was 108% of the electrically conductive particle diameter (4 μm), with the number of captured particles being 2. The ratio D (=D3/D1) of the distance D3 between the output terminals 21 and the output bumps 25 in the third row with respect to the distance D1 between the output terminals 21 and the output bumps 25 in the first row was 2.12.

Consideration of First Example

As shown in Table 1, with the connection body samples according to Examples 1 to 4 that were manufactured by using an anisotropic conductive film in which the electrically conductive particles were regularly arranged, the distance D3 between the output terminals 21 and the output bumps 25 at the central portion of the third output bump row $26_{-3}$ that was arranged most toward the outer side of all the bump rows was 130% or less of the distance D1 between the output terminals 21 and the output bumps 25 at the central portion of the first output bump row $26_{-1}$. There was almost no difference between the first row and the third row, so that satisfactory electrical continuity was implemented by squashing the electrically conductive particles.

Accordingly, with Examples 1 to 4, since, at the central portion of the third output bump row $26_{-3}$ for which the distance between the output terminals 21 and the output bumps 25 could most easily open up, the distance was not greatly different from that in the case of the first row, accordingly the distances between the other output terminals 21 and output bumps 25 of the second row and third row were also narrowed down, in a similar manner to the case with the first row, and it is considered that satisfactory electrical conduction was provided due to squashing of the electrically conductive particles. Furthermore since, with the connection body samples according to Examples 1 to 4, the electrically conductive particles were also squashed at the center of the third output bump row $26_{-3}$, it was also possible to clearly check the indentations of the electrically conductive particles that appeared at the rear surface of the glass board 12 for evaluation (refer to FIG. 2), and thus it was also possible to perform checking of the electrical continuity provided by the indentations with good accuracy.

On the other hand, in Comparative Example 1, the distance D3 between the output terminals 21 and the output bumps 25 at the central portion of the third output bump row $26_{-3}$ that was arranged most toward the outer side of all the bump rows was greater than 130% of the distance D1 between the output terminals 21 and the output bumps 25 at the central portion of the first output bump row $26_{-1}$, and it is seen that there was some loss of electrical continuity. Moreover, in Comparative Example 1, the squashing of the electrically conductive particles was insufficient, so that it also became difficult to verify the electrical continuity by observing the indentations.

Second Example

Next, a second Example will be described. In this second Example, as illustrated by B-B' and C-C' in FIG. 7, both end portions of the input and output bump rows 24 and 26 of the connection body samples according to Examples 1 to 4 and Comparative Example 1 were sectioned in the widthwise direction of the evaluation ICs 18, and the resulting sections were inspected. And, the average distances d1 and d3 between the output terminals 21 and the output bumps 25 at both end portions of the first and third output bump rows $26_{-1}$ and $26_{-3}$ were obtained respectively as proportions of the particle diameter of the electrically conductive particles, and the ratio d (=d3/d1) of the average distance at both end portions of the third output bump row $26_{-3}$ with respect to the average distance d1 at both end portions of the first output bump row $26_{-1}$ was calculated. The difference in the distances between the terminals and the bumps at both end portions of the first and third output bump rows 26 was within 30%.

Next, the ratio (D/d) was calculated of the ratio D (=D3/D1) of the distance D3 at the central portion of the third output bump row $26_{-3}$ with respect to the distance D1 at the central portion of the first output bump row $26_{-1}$ that was calculated in the first Example, with respect to the ratio d (=d3/d1) of the average distance at both end portions of the third output bump row $26_{-3}$ with respect to the average distance d1 at both end portions of the first output bump row $26_{-1}$. Because both ends of the output bump rows 26 can easily receive the pressure of the thermocompression bonding head, and, for both the first row and the third row, the distance between the output terminals 21 and the output bumps 25 is narrowed down so that the electrically conductive particles can easily be squashed. This is a reason for evaluating the ratio D at the central portion of the third output bump row $26_{-3}$ where the distance between the output terminals 21 and the output bumps 25 can most easily open up with respect to the central portion of the first output bump row $26_{-1}$, as compared to the ratio d at both end portions of the third output bump row $26_{-3}$ with respect to both end portions of the first output bump row $26_{-1}$. If the ratio D at the central portions of the output bump rows 26 where the distance between the output terminals 21 and the output bumps 25 can most easily open up is not greatly different from the ratio d at both end portions of the output bump rows 26, then it is considered that the distances between all the other output terminals 21 and output bumps 25 are narrowed down so that the electrically conductive particles are squashed therebetween, in a similar manner to the case at both end portions of the first and third output bump rows $26_{-1}$ and $26_{-3}$. In this second Example as well, the average numbers of electrically conductive particles captured between the output terminals 21 and the output bumps 25 at both end portions of the first and third output bump rows $26_{-1}$ and $26_{-3}$ were counted.

TABLE 2

| | | | Example 1 | Example 2 | Example 3 | Example 4 | Comparative Example 1 |
|---|---|---|---|---|---|---|---|
| IC (1 × 20 mm) | first row | average number of captured particles | 34 | 5 | 59 | 24 | 27 |
| | | average distance d1 between bumps and terminals (%) | 58 | 57 | 67 | 55 | 55 |
| | third row | average number of captured particles | 33 | 6 | 57 | 26 | 23 |
| | | average distance d3 between bumps and terminals (%) | 59 | 59 | 68 | 57 | 59 |
| | | d = (d3/d1) | 1.02 | 1.04 | 1.01 | 1.04 | 1.07 |
| | | D/d | 1.01 | 1.05 | 1.00 | 1.00 | 1.36 |
| IC (1.5 × 20 mm) | first row | average number of captured particles | 34 | 6 | 58 | 22 | 29 |
| | | average distance d1 between bumps and terminals (%) | 59 | 56 | 67 | 54 | 54 |
| | third row | average number of captured particles | 32 | 6 | 56 | 23 | 25 |
| | | average distance d3 between bumps and terminals (%) | 60 | 58 | 69 | 55 | 60 |
| | | d = (d3/d1) | 1.02 | 1.04 | 1.03 | 1.02 | 1.11 |
| | | D/d | 1.05 | 1.10 | 1.06 | 1.04 | 1.59 |
| IC (2 × 20 mm) | first row | average number of captured particles | 35 | 6 | 57 | 22 | 27 |
| | | average distance d1 between bumps and terminals (%) | 60 | 57 | 66 | 54 | 51 |
| | third row | average number of captured particles | 33 | 5 | 54 | 24 | 22 |
| | | average distance d3 between bumps and terminals (%) | 62 | 59 | 69 | 57 | 59 |
| | | d = (d3/d1) | 1.03 | 1.04 | 1.05 | 1.06 | 1.16 |
| | | D/d | 1.09 | 1.20 | 1.12 | 1.01 | 1.83 |

Results of Example 1

As shown in Table 2, with Example 1 when the evaluation IC (1×20 mm) was used, the average distance d1 between the output terminals 21 and the output bumps 25 at both end portions of the first output bump row $26_{-1}$ was 58% of the electrically conductive particle diameter (4 μm), with the average number of captured particles being 34; and the distance d3 between the output terminals 21 and the output bumps 25 at both end portions of the third output bump row $26_{-3}$ was 59% of the electrically conductive particle diameter (4 μm), with the average number of captured particles being 33.

The ratio d (=d3/d1) of the average distance d3 at both end portions of the third output bump row $26_{-3}$ with respect to the average distance d1 at both end portions of the first output bump row $26_{-1}$ was 1.02, so that the ratio thereto (D/d) of the ratio D (=D3/D1=1.03) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.01.

With Example 1 when the evaluation IC (1.5×20 mm) was used, the average distance d1 between the output terminals 21 and the output bumps 25 at both end portions of the first output bump row $26_{-1}$ was 59% of the electrically conductive particle diameter (4 μm), with the average number of captured particles being 34; and the average distance d3 between the output terminals 21 and the output bumps 25 at both end portions of the third output bump row $26_{-3}$ was 60% of the electrically conductive particle diameter (4 μm), with the average number of captured particles being 32.

The ratio d (=d3/d1) of the average distance d3 at both end portions of the third output bump row $26_{-3}$ with respect to the average distance d1 at both end portions of the first output bump row $26_{-1}$ was 1.02, so that the ratio thereto (D/d) of the ratio D (=D3/D1=1.07) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.05.

With Example 1 when the evaluation IC (2×20 mm) was used, the average distance d1 between the output terminals 21 and the output bumps 25 at both end portions of the first output bump row $26_{-1}$ was 60% of the electrically conductive particle diameter (4 μm), with the average number of captured particles being 35; and the distance d3 between the output terminals 21 and the output bumps 25 at both end portions of the third output bump row $26_{-3}$ was 62% of the electrically conductive particle diameter (4 μm), with the average number of captured particles being 33.

The ratio d (=d3/d1) of the average distance d3 at both end portions of the third output bump row $26_{-3}$ with respect to the average distance d1 at both end portions of the first output bump row $26_{-1}$ was 1.03, so that the ratio thereto (D/d) of the ratio D (=D3/D1=1.12) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.09.

Results of Example 2

With Example 2 when the evaluation IC (1×20 mm) was used, the average distance d1 between the output terminals 21 and the output bumps 25 at both end portions of the first output bump row $26_{-1}$ was 57% of the electrically conductive particle diameter (4 μm), with the average number of captured particles being 5; and the average distance d3 between the output terminals 21 and the output bumps 25 at both end portions of the third output bump row $26_{-3}$ was 59% of the electrically conductive particle diameter (4 μm), with the average number of captured particles being 6.

The ratio d (=d3/d1) of the average distance d3 at both end portions of the third output bump row $26_{-3}$ with respect to the average distance d1 at both end portions of the first output bump row $26_{-1}$ was 1.04, so that the ratio thereto (D/d) of the ratio D (=D3/D1=1.09) of the distance D3 between the output terminals 21 and the output bumps 25 in the third row with respect to the distance D1 between the output terminals 21 and the output bumps 25 in the first row at the central portions of the output bump rows 26, as obtained in the first Example, was 1.05.

With Example 2 when the evaluation IC (1.5×20 mm) was used, the average distance d1 between the output terminals 21 and the output bumps 25 at both end portions of the first output bump row $26_{-1}$ was 56% of the electrically conductive particle diameter (4 μm), with the average number of captured particles being 6; and the average distance d3 between the output terminals 21 and the output bumps 25 at both end portions of the third output bump row $26_{-3}$ was 58% of the electrically conductive particle diameter (4 μm), with the average number of captured particles being 6.

The ratio d (=d3/d1) of the average distance d3 at both end portions of the third output bump row $26_{-3}$ with respect to the average distance d1 at both end portions of the first output bump row $26_{-1}$ was 1.04, so that the ratio thereto (D/d) of the ratio D (=D3/D1=1.14) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.10.

With Example 2 when the evaluation IC (2×20 mm) was used, the average distance d1 between the output terminals 21 and the output bumps 25 at both end portions of the first output bump row $26_{-1}$ was 57% of the electrically conductive particle diameter (4 μm), with the average number of captured particles being 6; and the average distance d3 between the output terminals 21 and the output bumps 25 at both end portions of the third output bump row $26_{-3}$ was 59% of the electrically conductive particle diameter (4 μm), with the average number of captured particles being 5.

The ratio d (=d3/d1) of the average distance d3 at both end portions of the third output bump row $26_{-3}$ with respect to the average distance d1 at both end portions of the first output bump row $26_{-1}$ was 1.04, so that the ratio thereto (D/d) of the ratio D (=D3/D1=1.25) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.20.

Results of Example 3

With Example 3 when the evaluation IC (1×20 mm) was used, the average distance d1 between the output terminals 21 and the output bumps 25 at both end portions of the first output bump row $26_{-1}$ was 67% of the electrically conductive particle diameter (3 μm), with the average number of captured particles being 59; and the average distance d3 between the output terminals 21 and the output bumps 25 at both end portions of the third output bump row $26_{-3}$ was 68% of the electrically conductive particle diameter (3 μm), with the average number of captured particles being 57.

The ratio d (=d3/d1) of the average distance d3 at both end portions of the third output bump row $26_{-3}$ with respect to the average distance d1 at both end portions of the first output bump row $26_{-1}$ was 1.01, so that the ratio thereto (D/d) of the ratio D (=D3/D1=1.01) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.00.

With Example 3 when the evaluation IC (1.5×20 mm) was used, the average distance d1 between the output terminals 21 and the output bumps 25 at both end portions of the first output bump row $26_{-1}$ was 67% of the electrically conductive particle diameter (3 μm), with the average number of captured particles being 58; and the average distance d3 between the output terminals 21 and the output bumps 25 at both end portions of the third output bump row $26_{-3}$ was 69% of the electrically conductive particle diameter (3 μm), with the average number of captured particles being 56.

The ratio d (=d3/d1) of the average distance d3 at both end portions of the third output bump row $26_{-3}$ with respect to the average distance d1 at both end portions of the first output bump row $26_{-1}$ was 1.03, so that the ratio thereto (D/d) of the ratio D (=D3/D1=1.09) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.06.

With Example 3 when the evaluation IC (2×20 mm) was used, the average distance d1 between the output terminals 21 and the output bumps 25 at both end portions of the first output bump row $26_{-1}$ was 66% of the electrically conductive particle diameter (3 μm), with the average number of captured particles being 57; and the average distance d3 between the output terminals 21 and the output bumps 25 at both end portions of the third output bump row $26_{-3}$ was 69% of the electrically conductive particle diameter (3 μm), with the average number of captured particles being 54.

The ratio d (=d3/d1) of the average distance d3 at both end portions of the third output bump row $26_{-3}$ with respect to the average distance d1 at both end portions of the first output bump row $26_{-1}$ was 1.05, so that the ratio thereto (D/d) of the ratio D (=D3/D1=1.18) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.12.

Results of Example 4

With Example 4 when the evaluation IC (1×20 mm) was used, the average distance d1 between the output terminals 21 and the output bumps 25 at both end portions of the first output bump row $26_{-1}$ was 55% of the electrically conductive particle diameter (5 μm), with the average number of captured particles being 24; and the average distance d3 between the output terminals 21 and the output bumps 25 at both end portions of the third output bump row $26_{-3}$ was 57% of the electrically conductive particle diameter (5 μm), with the average number of captured particles being 26.

The ratio d (=d3/d1) of the average distance d3 at both end portions of the third output bump row $26_{-3}$ with respect to the average distance d1 at both end portions of the first output bump row $26_{-1}$ was 1.04, so that the ratio thereto (D/d) of the ratio D (=D3/D1=1.04) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.00.

With Example 4 when the evaluation IC (1.5×20 mm) was used, the average distance d1 between the output terminals 21 and the output bumps 25 at both end portions of the first output bump row $26_{-1}$ was 54% of the electrically conductive particle diameter (5 μm), with the average number of captured particles being 22; and the average distance d3 between the output terminals 21 and the output bumps 25 at both end portions of the third output bump row $26_{-3}$ was 55% of the electrically conductive particle diameter (5 μm), with the average number of captured particles being 23.

The ratio d (=d3/d1) of the average distance d3 at both end portions of the third output bump row $26_{-3}$ with respect to the average distance d1 at both end portions of the first output bump row $26_{-1}$ was 1.02, so that the ratio thereto (D/d) of the ratio D (=D3/D1=1.06) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.04.

With Example 4 when the evaluation IC (2×20 mm) was used, the average distance d1 between the output terminals 21 and the output bumps 25 at both end portions of the first output bump row $26_{-1}$ was 54% of the electrically conductive particle diameter (5 μm), with the average number of captured particles being 22; and the average distance d3 between the output terminals 21 and the output bumps 25 at both end portions of the third output bump row $26_{-3}$ was 57% of the electrically conductive particle diameter (5 μm), with the average number of captured particles being 24.

The ratio d (=d3/d1) of the average distance d3 at both end portions of the third output bump row $26_{-3}$ with respect to the average distance d1 at both end portions of the first output bump row $26_{-1}$ was 1.06, so that the ratio thereto (D/d) of the ratio D (=D3/D1=1.07) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.01.

Results of Comparative Example 1

With Comparative Example 1 when the evaluation IC (1×20 mm) was used, the average distance d1 between the output terminals 21 and the output bumps 25 at both end portions of the first output bump row $26_{-1}$ was 55% of the electrically conductive particle diameter (4 μm), with the average number of captured particles being 27; and the average distance d3 between the output terminals 21 and the output bumps 25 at both end portions of the third output bump row $26_{-3}$ was 59% of the electrically conductive particle diameter (4 μm), with the average number of captured particles being 23.

The ratio d (=d3/d1) of the average distance d3 at both end portions of the third output bump row $26_{-3}$ with respect to the average distance d1 at both end portions of the first output bump row $26_{-1}$ was 1.07, so that the ratio thereto (D/d) of the ratio D (=D3/D1=1.45) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.36.

With Comparative Example 1 when the evaluation IC (1.5×20 mm) was used, the average distance d1 between the output terminals 21 and the output bumps 25 at both end portions of the first output bump row $26_{-1}$ was 54% of the electrically conductive particle diameter (4 μm), with the average number of captured particles being 29; and the average distance d3 between the output terminals 21 and the output bumps 25 at both end portions of the third output bump row 26$_{-3}$ was 60% of the electrically conductive particle diameter (4 µm), with the average number of captured particles being 25.

The ratio d (=d3/d1) of the average distance d3 at both end portions of the third output bump row 26$_{-3}$ with respect to the average distance d1 at both end portions of the first output bump row 26$_{-1}$ was 1.11, so that the ratio thereto (D/d) of the ratio D (=D3/D1=1.76) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.59.

With Comparative Example 1 when the evaluation IC (2×20 mm) was used, the average distance d1 between the output terminals 21 and the output bumps 25 at both end portions of the first output bump row 26$_{-1}$ was 51% of the electrically conductive particle diameter (4 µm), with the average number of captured particles being 27; and the average distance d3 between the output terminals 21 and the output bumps 25 at both end portions of the third output bump row 26$_{-3}$ was 59% of the electrically conductive particle diameter (4 µm), with the average number of captured particles being 22.

The ratio d (=d3/d1) of the average distance d3 at both end portions of the third output bump row 26$_{-3}$ with respect to the average distance d1 at both end portions of the first output bump row 26$_{-1}$ was 1.16, so that the ratio thereto (D/d) of the ratio D (=D3/D1=2.12) of the distance D3 between the output terminals 21 and the output bumps 25 in the third row with respect to the distance D1 between the output terminals 21 and the output bumps 25 in the first row at the central portion of the output bump row 26, as obtained in the first Example, was 1.83.

Consideration of Second Example

As shown in Table 2, with the connection body samples according to Examples 1 to 4 that were manufactured by using an anisotropic conductive film in which electrically conductive particles were regularly arranged, the ratio D of the distance between the output terminals 21 and the output bumps 25 in the third row with respect to that in the first row at the central portion of the output bump row 26, for which, of all the bump rows, the distance between the output terminals 21 and the output bumps 25 can most easily open up, was 130% or less of the ratio d of the distance between the output terminals 21 and the output bumps 25 of the third row with respect to that of the first row at both end portions of the output bump row 26, for which, comparatively, the output terminals 21 and the output bumps 25 most closely approach one another, and there was almost no difference. As a result, satisfactory electrical continuity was implemented by squashing the electrically conductive particles.

Accordingly, with Examples 1 to 4, since, at the central portions of the output bump row 26 for which the distance between the output terminals 21 and the output bumps 25 can most easily open up, the distance was not greatly proportionally different from those at both end portions, accordingly the distance ratio between the other output terminals 21 and output bumps 25 of the second row and third row were also narrowed down, in a similar manner to the case with those at both end portions of the first row and the third row, and it is considered that satisfactory electrical conduction was implemented by squashing of the electrically conductive particles. Furthermore since, with the connection body samples according to Examples 1 to 4, the electrically conductive particles were also squashed at the central portions of the output bump rows 26, accordingly it was also possible to clearly check the indentations of the electrically conductive particles that appeared at the rear surface of the glass board 12 for evaluation, and it was also possible to perform checking of the electrical continuity provided by the indentations with good accuracy.

On the other hand, in Comparative Example 1, at the central portions of the output bump rows 26, the distance ratio D between the output terminals 21 and the output bumps 25 in the third row with respect to the first row was more than 130% of the ratio d at both end portions, and there was some loss of electrical continuity. Moreover, in Comparative Example 1, the squashing of the electrically conductive particles was insufficient, so that it also became difficult to verify the electrical continuity by observing the indentations.

Third Example

Next, a third Example will be described. In this third Example, for each of the connection body samples according to Examples 1 to 4 and Comparative Example 1, the average distance $d_{AVE}$ between the output terminals 21 and the output bumps 25 at both ends of the input bump row 24 illustrated in FIG. 7 and at both ends of the third output bump row 26$_{-3}$ that was arranged most toward the outer side, and the ratio (=D3/$d_{AVE}$) of the distance D3 between the output terminals 21 and the output bumps 25 at the central portion of the third output bump row 26$_{-3}$ to the $d_{AVE}$ were calculated. This is an evaluation value for comparing the distance D3 between the output terminals 21 and the output bumps 25 at the central portion of the third output bump row 26$_{-3}$ where the distance between the output terminals 21 and the output bumps 25 can easily open up, and the average distance $d_{AVE}$ between the output terminals 21 and the output bumps 25 at both ends of the input and output bump rows 24 and 26 that are arranged most toward the outer side, because both ends of the input and output bump rows 24 and 26 that are arranged most toward the outer side can easily receive the pressure of the thermocompression bonding head, and accordingly the distances between all of the output terminals 21 and the output bumps 25 can easily be narrowed down so that the electrically conductive particles can be easily squashed. If there is no great difference between the distance D3 at the central portion of the third output bump row 26$_{-3}$ and the average distance $d_{AVE}$ at both end portions of the input and output bump rows 24 and 26 that are arranged most toward the outer side, then it is considered that the distance between all the other output terminals 21 and output bumps 25 has been squeezed down and that the electrically conductive particles have been squashed, in a similar manner to the case with the both end portions of the input and output bump rows 24 and 26 that are arranged most toward the outer side.

In this Example, since the input bump row 24 was arranged as one row, the measuring object was the input bumps 23L and 23R provided at the both ends of that input bump row 24, on the other hand, if a plurality of input bump rows 24 are provided in parallel, then the input bumps 23 provided at the both ends of the input bump row 24 arranged most toward the outer side are taken as being the measuring object of the average distance $d_{AVE}$ between the output terminals 21 and the output bumps 25. In a similar manner, in this Example, since the output bump rows 26 were arranged as three rows, the output bumps 25L and 25R provided at the both ends of the third output bump row 26$_{-3}$ arranged most toward the outer side were taken as being the measuring object of the average distance $d_{AVE}$ between the output terminals 21 and the output bumps 25.

between the two output bumps 25L and 25R and the two input bumps 23L and 23R and their input and output

TABLE 3

|  |  |  | Example 1 | Example 2 | Example 3 | Example 4 | Comparative Example 1 |
|---|---|---|---|---|---|---|---|
| IC (1 × 20 mm) | bumps 25L | distance $d_{-26L}$ between bumps and terminals (%) | 59 | 59 | 68 | 57 | 59 |
|  | bumps 25R | distance $d_{-26R}$ between bumps and terminals (%) | 60 | 57 | 67 | 58 | 61 |
|  | bumps 23L | distance $d_{-24L}$ between bumps and terminals (%) | 58 | 60 | 65 | 54 | 57 |
|  | bump 23R | distance $d_{-24R}$ between bumps and terminals (%) | 61 | 58 | 66 | 56 | 58 |
|  | average distance $d_{AVE}$ between bumps and terminals (%) |  | 59.5 | 58.5 | 66.5 | 56.25 | 58.75 |
|  | D3/$d_{AVE}$ |  | 1.08 | 1.06 | 1.05 | 1.01 | 1.43 |
| IC (1.5 × 20 mm) | bumps 25L | distance $d_{-26L}$ between bumps and terminals (%) | 60 | 58 | 69 | 55 | 60 |
|  | bumps 25R | distance $d_{-26R}$ between bumps and terminals (%) | 62 | 58 | 67 | 57 | 61 |
|  | bumps 23L | distance $d_{-24L}$ between bumps and terminals (%) | 62 | 56 | 64 | 55 | 56 |
|  | bump 23R | distance $d_{-24R}$ between bumps and terminals (%) | 61 | 55 | 65 | 56 | 57 |
|  | average distance $d_{AVE}$ between bumps and terminals (%) |  | 61.25 | 56.75 | 66.25 | 55.75 | 58.5 |
|  | D3/$d_{AVE}$ |  | 1.04 | 1.09 | 1.06 | 1.02 | 1.44 |
| IC (2 × 20 mm) | bumps 25L | distance $d_{-26L}$ between bumps and terminals (%) | 62 | 59 | 69 | 57 | 59 |
|  | bumps 25R | distance $d_{-26R}$ between bumps and terminals (%) | 61 | 57 | 67 | 56 | 58 |
|  | bumps 23L | distance $d_{-24L}$ between bumps and terminals (%) | 59 | 56 | 64 | 58 | 56 |
|  | bump 23R | distance $d_{-24R}$ between bumps and terminals (%) | 60 | 58 | 66 | 55 | 54 |
|  | average distance $d_{AVE}$ between bumps and terminals (%) |  | 60.5 | 57.5 | 66.5 | 56.5 | 56.75 |
|  | D3/$d_{AVE}$ |  | 1.06 | 1.08 | 1.05 | 1.01 | 1.48 |

Results of Example 1

As shown in Table 3, with Example 1 when the evaluation IC (1×20 mm) was used, the distance $d_{-26L}$ between the output bump 25L at the left end of the third output bump row $26_{-3}$ and its output terminal 21 was 59% of the electrically conductive particle diameter (4 μm), the distance $d_{-26R}$ between the output bump 25R at the right end of that bump row and its output terminal 21 was 60% of that diameter, the distance $d_{-24L}$ between the input bump 23L at the left end of the input bump row 24 and its input terminal 19 was 58% of that diameter, and the distance $d_{-24R}$ between the input bump 23R at the right end of that bump row and its input terminal 19 was 61% of that diameter; so that the average distance $d_{AVE}$ between the two output bumps 25L and 25R and the two input bumps 23L and 23R and their input and output terminals was 59.5%. The ratio (=D3/$d_{AVE}$) of the distance D3 (=64%) between the output terminals 21 and the output bumps 25 at the central portion of the third output bump row $26_{-3}$ to this average distance $d_{AVE}$ was 1.08.

With Example 1 when the evaluation IC (1.5×20 mm) was used, the distance $d_{-26L}$ between the output bump 25L at the left end of the third output bump row $26_{-3}$ and its output terminal 21 was 60% of the electrically conductive particle diameter (4 μm), the distance $d_{-26R}$ between the output bump 25R at the right end of that bump row and its output terminal 21 was 62% of that diameter, the distance $d_{-24L}$ between the input bump 23L at the left end of the input bump row 24 and its input terminal 19 was 62% of that diameter, and the distance $d_{-24R}$ between the input bump 23R at the right end of that bump row and its input terminal 19 was 61% of that diameter; so that the average distance $d_{AVE}$ between the two output bumps 25L and 25R and the two input bumps 23L and 23R and their input and output terminals was 61.25%. The ratio (=D3/$d_{AVE}$) of the distance D3 (=65%) between the output terminals 21 and the output bumps 25 at the central portion of the third output bump row $26_{-3}$ to this average distance $d_{AVE}$ was 1.04.

With Example 1 when the evaluation IC (2×20 mm) was used, the distance $d_{-26L}$ between the output bump 25L at the left end of the third output bump row $26_{-3}$ and its output terminal 21 was 62% of the electrically conductive particle diameter (4 μm), the distance $d_{-26R}$ between the output bump 25R at the right end of that bump row and its output terminal 21 was 61% of that diameter, the distance $d_{-24L}$ between the input bump 23L at the left end of the input bump row 24 and its input terminal 19 was 59% of that diameter, and the distance $d_{-24R}$ between the input bump 23R at the right end of that bump row and its input terminal 19 was 60% of that diameter; so that the average distance $d_{AVE}$ between the two output bumps 25L and 25R and the two input bumps 23L and 23R and their input and output terminals was 60.5%. The ratio (=D3/$d_{AVE}$) of the distance D3 (=67%) between the output terminals 21 and the output bumps 25 at the central portion of the third output bump row $26_{-3}$ to this average distance $d_{AVE}$ was 1.06.

Results of Example 2

With Example 2 when the evaluation IC (1×20 mm) was used, the distance $d_{-26L}$ between the output bump 25L at the left end of the third output bump row $26_{-3}$ and its output terminal 21 was 59% of the electrically conductive particle diameter (4 μm), the distance $d_{-26R}$ between the output bump 25R at the right end of that bump row and its output terminal 21 was 57% of that diameter, the distance $d_{-24L}$ between the input bump 23L at the left end of the input bump row 24 and its input terminal 19 was 60% of that diameter, and the distance $d_{-24R}$ between the input bump 23R at the right end of that bump row and its input terminal 19 was 58% of that diameter; so that the average distance $d_{AVE}$ between the two output bumps 25L and 25R and the two input bumps 23L and 23R and their input and output terminals was 58.5%. The ratio (=D3/$d_{AVE}$) of the distance D3 (=62%) between the output terminals 21 and the output bumps 25 at the central portion of the third output bump row 26$_{-3}$ to this average distance $d_{AVE}$ was 1.06.

With Example 2 when the evaluation IC (1.5×20 mm) was used, the distance $d_{-26L}$ between the output bump 25L at the left end of the third output bump row 26$_{-3}$ and its output terminal 21 was 58% of the electrically conductive particle diameter (4 μm), the distance $d_{-26R}$ between the output bump 25R at the right end of that bump row and its output terminal 21 was 58% of that diameter, the distance $d_{-24L}$ between the input bump 23L at the left end of the input bump row 24 and its input terminal was 56% of that diameter, and the distance $d_{-24R}$ between the input bump 23R at the right end of that bump row and its input terminal 19 was 55% of that diameter; so that the average distance $d_{AVE}$ between the two output bumps 25L and 25R and the two input bumps 23L and 23R and their input and output terminals was 56.75%. The ratio (=D3/$d_{AVE}$) of the distance D3 (=64%) between the output terminals 21 and the output bumps 25 at the central portion of the third output bump row 26$_{-3}$ to this average distance $d_{AVE}$ was 1.09.

With Example 2 when the evaluation IC (2×20 mm) was used, the distance $d_{-26L}$ between the output bump 25L at the left end of the third output bump row 26-3 and its output terminal 21 was 59% of the electrically conductive particle diameter (4 μm), the distance $d_{-26R}$ between the output bump 25R at the right end of that bump row and its output terminal 21 was 57% of that diameter, the distance $d_{-24L}$ between the input bump 23L at the left end of the input bump row 24 and its input terminal 19 was 56% of that diameter, and the distance $d_{-24R}$ between the input bump 23R at the right end of that bump row and its input terminal 19 was 58% of that diameter; so that the average distance $d_{AVE}$ between the two output bumps 25L and 25R and the two input bumps 23L and 23R and their input and output terminals was 57.5%. The ratio (=D3/$d_{AVE}$) of the distance D3 (=69%) between the output terminals 21 and the output bumps 25 at the central portion of the third output bump row 26$_{-3}$ to this average distance $d_{AVE}$ was 1.08.

Results of Example 3

With Example 3 when the evaluation IC (1×20 mm) was used, the distance $d_{-26L}$ between the output bump 25L at the left end of the third output bump row 26$_{-3}$ and its output terminal 21 was 68% of the electrically conductive particle diameter (3 μm), the distance $d_{-26R}$ between the output bump 25R at the right end of that bump row and its output terminal 21 was 67% of that diameter, the distance $d_{-24L}$ between the input bump 23L at the left end of the input bump row 24 and its input terminal 19 was 65% of that diameter, and the distance $d_{-24R}$ between the input bump 23R at the right end of that bump row and its input terminal 19 was 66% of that diameter; so that the average distance $d_{AVE}$ between the two output bumps 25L and 25R and the two input bumps 23L and 23R and their input and output terminals was 66.5%. The ratio (=D3/$d_{AVE}$) of the distance D3 (=70%) between the output terminals 21 and the output bumps 25 at the central portion of the third output bump row 26$_{-3}$ to this average distance $d_{AVE}$ was 1.05.

With Example 3 when the evaluation IC (1.5×20 mm) was used, the distance $d_{-26L}$ between the output bump 25L at the left end of the third output bump row 26-3 and its output terminal 21 was 69% of the electrically conductive particle diameter (3 μm), the distance $d_{-26R}$ between the output bump 25R at the right end of that bump row and its output terminal 21 was 67% of that diameter, the distance $d_{-24L}$ between the input bump 23L at the left end of the input bump row 24 and its input terminal 19 was 64% of that diameter, and the distance $d_{-24R}$ between the input bump 23R at the right end of that bump row and its input terminal 19 was 65% of that diameter; so that the average distance $d_{AVE}$ between the two output bumps 25L and 25R and the two input bumps 23L and 23R and their input and output terminals was 66.25%. The ratio (=D3/$d_{AVE}$) of the distance D3 (=74%) between the output terminals 21 and the output bumps 25 at the central portion of the third output bump row 26$_{-3}$ to this average distance $d_{AVE}$ was 1.06.

With Example 3 when the evaluation IC (2×20 mm) was used, the distance $d_{-26L}$ between the output bump 25L at the left end of the third output bump row 26$_{-3}$ and its output terminal 21 was 69% of the electrically conductive particle diameter (3 μm), the distance $d_{-26R}$ between the output bump 25R at the right end of that bump row and its output terminal 21 was 67% of that diameter, the distance $d_{-24L}$ between the input bump 23L at the left end of the input bump row 24 and its input terminal 19 was 64% of that diameter, and the distance $d_{-24R}$ between the input bump 23R at the right end of that bump row and its input terminal 19 was 66% of that diameter; so that the average distance $d_{AVE}$ between the two output bumps 25L and 25R and the two input bumps 23L and 23R and their input and output terminals was 66.5%. The ratio (=D3/$d_{AVE}$) of the distance D3 (=80%) between the output terminals 21 and the output bumps 25 at the central portion of the third output bump row 26$_{-3}$ to this average distance $d_{AVE}$ was 1.05.

Results of Example 4

With Example 4 when the evaluation IC (1×20 mm) was used, the distance $d_{-26L}$ between the output bump 25L at the left end of the third output bump row 26$_{-3}$ and its output terminal 21 was 57% of the electrically conductive particle diameter (5 μm), the distance $d_{-26R}$ between the output bump 25R at the right end of that bump row and its output terminal 21 was 58% of that diameter, the distance $d_{-24L}$ between the input bump 23L at the left end of the input bump row 24 and its input terminal 19 was 54% of that diameter, and the distance $d_{-24R}$ between the input bump 23R at the right end of that bump row and its input terminal 19 was 56% of that diameter; so that the average distance $d_{AVE}$ between the two output bumps 25L and 25R and the two input bumps 23L and 23R and their input and output terminals was 56.25%. The ratio (=D3/$d_{AVE}$) of the distance D3 (=57%) between the output terminals 21 and the output bumps 25 at the central portion of the third output bump row 26$_{-3}$ to this average distance $d_{AVE}$ was 1.01.

With Example 4 when the evaluation IC (1.5×20 mm) was used, the distance $d_{-26L}$ between the output bump 25L at the left end of the third output bump row 26$_{-3}$ and its output terminal 21 was 55% of the electrically conductive particle diameter (5 μm), the distance $d_{-26K}$ between the output bump 25R at the right end of that bump row and its output terminal 21 was 57% of that diameter, the distance $d_{-24L}$ between the input bump 23L at the left end of the input bump row 24 and its input terminal 19 was 55% of that diameter, and the distance $d_{-24R}$ between the input bump 23R at the right end of that bump row and its input terminal 19 was 56% of that diameter; so that the average distance $d_{AVE}$ between the two output bumps 25L and 25R and the two input bumps 23L and 23R and their input and output terminals was 55.75%. The ratio (=D3/$d_{AVE}$) of the distance D3 (=57%) between the output terminals 21 and the output bumps 25 at the central portion of the third output bump row $26_{-3}$ to this average distance $d_{AVE}$ was 1.02.

Example 4 when the evaluation IC (2×20 mm) was used, the distance $d_{-26L}$ between the output bump 25L at the left end of the third output bump row $26_{-3}$ and its output terminal 21 was 57% of the electrically conductive particle diameter (5 μm), the distance $d_{-26R}$ between the output bump 25R at the right end of that bump row and its output terminal 21 was 56% of that diameter, the distance $d_{-24L}$ between the input bump 23L at the left end of the input bump row 24 and its input terminal 19 was 58% of that diameter, and the distance $d_{-24R}$ between the input bump 23R at the right end of that bump row and its input terminal 19 was 55% of that diameter; so that the average distance $d_{AVE}$ between the two output bumps 25L and 25R and the two input bumps 23L and 23R and their input and output terminals was 56.5%. The ratio (=D3/$d_{AVE}$) of the distance D3 (=59%) between the output terminals 21 and the output bumps 25 at the central portion of the third output bump row $26_{-3}$ to this average distance $d_{AVE}$ was 1.01.

Results of Comparative Example 1

With Comparative Example 1 when the evaluation IC (1×20 mm) was used, the distance $d_{-26L}$ between the output bump 25L at the left end of the third output bump row $26_{-3}$ and its output terminal 21 was 59% of the electrically conductive particle diameter (4 μm), the distance $d_{-26R}$ between the output bump 25R at the right end of that bump row and its output terminal 21 was 61% of that diameter, the distance $d_{-24L}$ between the input bump 23L at the left end of the input bump row 24 and its input terminal 19 was 57% of that diameter, and the distance $d_{-24R}$ between the input bump 23R at the right end of that bump row and its input terminal 19 was 58% of that diameter; so that the average distance $d_{AVE}$ between the two output bumps 25L and 25R and the two input bumps 23L and 23R and their input and output terminals was 58.75%. The ratio (=D3/$d_{AVE}$) of the distance D3 (=84%) between the output terminals 21 and the output bumps 25 at the central portion of the third output bump row $26_{-3}$ to this average distance $d_{AVE}$ was 1.43.

With Comparative Example 1 when the evaluation IC (1.5×20 mm) was used, the distance $d_{-26L}$ between the output bump 25L at the left end of the third output bump row $26_{-3}$ and its output terminal 21 was 60% of the electrically conductive particle diameter (4 μm), the distance $d_{-26R}$ between the output bump 25R at the right end of that bump row and its output terminal 21 was 61% of that diameter, the distance $d_{-24L}$ between the input bump 23L at the left end of the input bump row 24 and its input terminal 19 was 56% of that diameter, and the distance $d_{-24R}$ between the input bump 23R at the right end of that bump row and its input terminal 19 was 57% of that diameter; so that the average distance $d_{AVE}$ between the two output bumps 25L and 25R and the two input bumps 23L and 23R and their input and output terminals was 58.5%. The ratio (=D3/$d_{AVE}$) of the distance D3 (=95%) between the output terminals 21 and the output bumps 25 at the central portion of the third output bump row $26_{-3}$ to this average distance $d_{AVE}$ was 1.44.

With Comparative Example 1 when the evaluation IC (2×20 mm) was used, the distance $d_{-26L}$ between the output bump 25L at the left end of the third output bump row $26_{-3}$ and its output terminal 21 was 59% of the electrically conductive particle diameter (4 μm), the distance $d_{-26R}$ between the output bump 25R at the right end of that bump row and its output terminal 21 was 58% of that diameter, the distance $d_{-24L}$ between the input bump 23L at the left end of the input bump row 24 and its input terminal 19 was 56% of that diameter, and the distance $d_{-24R}$ between the input bump 23R at the right end of that bump row and its input terminal 19 was 54% of that diameter; so that the average distance $d_{AVE}$ between the two output bumps 25L and 25R and the two input bumps 23L and 23R and their input and output terminals was 56.75%. The ratio (=D3/$d_{AVE}$) of the distance D3 (=108%) between the output terminals 21 and the output bumps 25 at the central portion of the third output bump row $26_{-3}$ to this average distance $d_{AVE}$ was 1.48.

Consideration of Third Example

As shown in Table 3, with the connection body samples according to Examples 1 to 4 that were manufactured by using an anisotropic conductive film in which the electrically conductive particles were regularly arranged, the distance D3 between the output terminals 21 and the output bumps 25 at the central portion of the third output bump row $26_{-3}$ for which, of all the bump rows, the distance between the terminals and the bumps could most easily open up, was 110% or less of the average distance $d_{AVE}$ between the output terminals 21 and the output bumps 25 at the both end portions of the input and output bump rows 24 and 26 that were arranged most toward the outer side, and there was almost no difference. As a result, satisfactory electrical continuity was implemented by squashing the electrically conductive particles.

Thus in Examples 1 to 4, since, at the central portion of the third output bump row $26_{-3}$ where the distance between the output terminals 21 and the output bumps 25 can most easily open up, there was no great difference in distance from the both end portions of the input and output bump rows 24 and 26 that are arranged most toward the outer side, accordingly the distances in both the second row and the third row between the other output terminals 21 and output bumps 25 also were narrowed down in a similar manner to the case with both end portions of the input and output bump rows 24 and 26, and thus it is considered that satisfactory electrical conduction was implemented by squashing of the electrically conductive particles. Moreover, according to the connection body samples according to Examples 1 to 4, since the electrically conductive particles were also squashed at the central portion of the third output bump row $26_{-3}$, it was possible to clearly check the indentations upon the electrically conductive particles that appeared at the rear surface of the glass board 12 for evaluation, and it was also possible to perform checking of the electrical continuity due to the indentations with good accuracy.

On the other hand, in Comparative Example 1, the distance D3 between the output terminals 21 and the output bumps 25 at the central portion of the third output bump row $26_{-3}$ became greater than 110% with respect to the average distance $d_{AVE}$ between the output terminals 21 and the output bumps 25 at both end portions of the input and output bump rows 24 and 26 that were arranged most toward the outer side, and as a result there was some loss of electrical continuity. Moreover, in Comparative Example 1, the squashing of the electrically conductive particles was insufficient, so that it also became difficult to verify the electrical continuity by observing the indentations.

Fourth Example

Next, a fourth Example will be described. In this fourth Example, as elements for evaluation, connection body samples were manufactured using ICs that had concave and convex portions upon their bump surfaces where the electrically conductive particles were to be captured. In the specimens that were used for evaluation, the maximum difference in elevation of these concave and convex portions was within 50% of the particle diameter of the electrically conductive particles. Before connecting these specimens, the bump surfaces were measured with a high accuracy shape measurement system (KS-1100, manufactured by KEYENCE CORPORATION), and the results were also obtained from sectional inspection. The maximum difference in elevation of the concavities and convexities of the bump surfaces that were evaluated was 2 μm in the case of Examples 1 and 2 and Comparative Example 1, 1.5 μm in the case of Example 3, and 2.5 μm in the case of Example 4.

For each of the connection body samples of this type, the numbers of particles captured in the concave regions and captured in the convex regions were counted. The concave regions and the convex regions on the bump surfaces were set so that the area proportions of the concave regions and the convex regions were each 50%. The areas of the concave regions and the areas of the convex regions were each present over 35% or greater of the corresponding whole bump surface.

The external shapes of the ICs according to the fourth Example, the sizes of the bumps, and the width of the spaces between the bumps, were the same as in the case of the evaluation ICs described above. Moreover, the boards for evaluation according to the fourth Example to which the ICs are connected were the same as the glass boards for evaluation according to the first to third Examples.

particles above its convex regions was 19, the number of captured particles above the concave regions of the output bump 25 at the central portion of the third output bump row $26_{-3}$ was 1, and the number of captured particles above its convex regions was 15.

With Example 1 when the evaluation IC (2×20 mm) was used, the number of captured particles above the concave regions of the output bump 25 at the central portion of the first output bump row $26_{-1}$ was 3, the number of captured particles above its convex regions was 18, the number of captured particles above the concave regions of the output bump 25 at the central portion of the third output bump row $26_{-3}$ was 2, and the number of captured particles above its convex regions was 14.

Results of Example 2

With Example 2 when the evaluation IC (1×20 mm) was used, the number of captured particles above the concave regions of the output bump 25 at the central portion of the first output bump row $26_{-1}$ was 0, the number of captured particles above its convex regions was 4, the number of captured particles above the concave regions of the output bump 25 at the central portion of the third output bump row $26_{-3}$ was 0, and the number of captured particles above its convex regions was 3.

With Example 2 when the evaluation IC (1.5×20 mm) was used, the number of captured particles above the concave regions of the output bump 25 at the central portion of the

TABLE 4

|  |  |  |  | Example 1 | Example 2 | Example 3 | Example 4 | Comparative Example 1 |
|---|---|---|---|---|---|---|---|---|
| IC (1 × 20 mm) | number of captured particles | first row | concave region | 2 | 0 | 4 | 2 | 2 |
|  |  |  | convex region | 17 | 4 | 37 | 14 | 10 |
|  |  | third row | concave region | 1 | 0 | 2 | 1 | 1 |
|  |  |  | convex region | 16 | 3 | 36 | 13 | 3 |
| IC (1.5 × 20 mm) | number of captured particles | first row | concave region | 3 | 0 | 3 | 3 | 1 |
|  |  |  | convex region | 19 | 5 | 34 | 15 | 11 |
|  |  | third row | concave region | 1 | 1 | 3 | 1 | 1 |
|  |  |  | convex region | 15 | 3 | 31 | 11 | 1 |
| IC (2 × 20 mm) | number of captured particles | first row | concave region | 3 | 1 | 3 | 2 | 2 |
|  |  |  | convex region | 18 | 4 | 35 | 15 | 12 |
|  |  | third row | concave region | 2 | 0 | 2 | 2 | 0 |
|  |  |  | convex region | 14 | 3 | 30 | 10 | 0 |

With this Example 4, for the connection body samples according to Examples 1 to 4 and Comparative Example 1, the indentations that appeared at the output terminals were observed from the rear surface of the glass boards for evaluation, and the numbers of captured electrically conductive particles were counted in the concave regions and the convex regions of the output bumps 25 at the central portions of the first and third output bump rows $26_{-1}$ and $26_{-3}$ shown by A-A' in FIG. 7.

Results of Example 1

With Example 1 when the evaluation IC (1×20 mm) was used, the number of captured particles above the concave regions of the output bump 25 at the central portion of the first output bump row $26_{-1}$ was 2, the number of captured particles above its convex regions was 17, the number of captured particles above the concave regions of the output bump 25 at the central portion of the third output bump row $26_{-3}$ was 1, and the number of captured particles above its convex regions was 16.

With Example 1 when the evaluation IC (1.5×20 mm) was used, the number of captured particles above the concave regions of the output bump 25 at the central portion of the first output bump row $26_{-1}$ was 3, the number of captured first output bump row $26_{-1}$ was 0, the number of captured particles above its convex regions was 5, the number of captured particles above the concave regions of the output bump 25 at the central portion of the third output bump row $26_{-3}$ was 1, and the number of captured particles above its convex regions was 3.

With Example 2 when the evaluation IC (2×20 mm) was used, the number of captured particles above the concave regions of the output bump 25 at the central portion of the first output bump row $26_{-1}$ was 1, the number of captured particles above its convex regions was 4, the number of captured particles above the concave regions of the output bump 25 at the central portion of the third output bump row $26_{-3}$ was 0, and the number of captured particles above its convex regions was 3.

Results of Example 3

With Example 3 when the evaluation IC (1×20 mm) was used, the number of captured particles above the concave regions of the output bump 25 at the central portion of the first output bump row $26_{-1}$ was 4, the number of captured particles above its convex regions was 37, the number of captured particles above the concave regions of the output bump 25 at the central portion of the third output bump row 26_-3 was 2, and the number of captured particles above its convex regions was 36.

With Example 3 when the evaluation IC (1.5×20 mm) was used, the number of captured particles above the concave regions of the output bump 25 at the central portion of the first output bump row 26_-1 was 3, the number of captured particles above its convex regions was 34, the number of captured particles above the concave regions of the output bump 25 at the central portion of the third output bump row 26_-3 was 3, and the number of captured particles above its convex regions was 31.

With Example 3 when the evaluation IC (2×20 mm) was used, the number of captured particles above the concave regions of the output bump 25 at the central portion of the first output bump row 26_-1 was 3, the number of captured particles above its convex regions was 35, the number of captured particles above the concave regions of the output bump 25 at the central portion of the third output bump row 26_-3 was 2, and the number of captured particles above its convex regions was 30.

Results of Example 4

With Example 4 when the evaluation IC (1×20 mm) was used, the number of captured particles above the concave regions of the output bump 25 at the central portion of the first output bump row 26_-1 was 2, the number of captured particles above its convex regions was 14, the number of captured particles above the concave regions of the output bump 25 at the central portion of the third output bump row 26_-3 was 1, and the number of captured particles above its convex regions was 13.

With Example 4 when the evaluation IC (1.5×20 mm) was used, the number of captured particles above the concave regions of the output bump 25 at the central portion of the first output bump row 26_-1 was 3, the number of captured particles above its convex regions was 15, the number of captured particles above the concave regions of the output bump 25 at the central portion of the third output bump row 26_-3 was 1, and the number of captured particles above its convex regions was 11.

With Example 4 when the evaluation IC (2×20 mm) was used, the number of captured particles above the concave regions of the output bump 25 at the central portion of the first output bump row 26_-1 was 2, the number of captured particles above its convex regions was 15, the number of captured particles above the concave regions of the output bump 25 at the central portion of the third output bump row 26_-3 was 2, and the number of captured particles above its convex regions was 10.

Results of Comparative Example 1

With Comparative Example 1 when the evaluation IC (1×20 mm) was used, the number of captured particles above the concave regions of the output bump 25 at the central portion of the first output bump row 26_-1 was 2, the number of captured particles above its convex regions was 10, the number of captured particles above the concave regions of the output bump 25 at the central portion of the third output bump row 26_-3 was 1, and the number of captured particles above its convex regions was 3.

With Comparative Example 1 when the evaluation IC (1.5×20 mm) was used, the number of captured particles above the concave regions of the output bump 25 at the central portion of the first output bump row 26_-1 was 1, the number of captured particles above its convex regions was 11, the number of captured particles above the concave regions of the output bump 25 at the central portion of the third output bump row 26_-3 was 1, and the number of captured particles above its convex regions was 1.

And with Comparative Example 1 when the evaluation IC (2×20 mm) was used, the number of captured particles above the concave regions of the output bump 25 at the central portion of the first output bump row 26_-1 was 2, the number of captured particles above its convex regions was 12, the number of captured particles above the concave regions of the output bump 25 at the central portion of the third output bump row 26_-3 was 0, and the number of captured particles above its convex regions was 0.

Consideration of Fourth Example

As shown in Table 4, with the connection body samples according to Examples 1 to 4 that were manufactured by using an anisotropic conductive film in which the electrically conductive particles are regularly arranged, three or more indentations were observed at the convex regions of the output bumps 25 at the central portions of all of the first and third output bump rows 26_-1 and 26_-3, and there was almost no difference between the first row and the third row, so that satisfactory electrical continuity was implemented by squashing the electrically conductive particles. This was due to the electrically conductive particles being sufficiently squashed in those convex regions, since, the electrically conductive particles were regularly arranged, they were nevertheless properly captured in the convex regions, even if the electrically conductive particles could not be sufficiently squashed in the concave regions formed in the bump surfaces in which the electrically conductive particles were captured.

Accordingly, in Examples 1 to 4, since at the central portion of the third output bump row 26_-3 which is the one for which the distance between the output terminals 21 and the output bumps 25 could most easily open up, the indentations and the number of captured particles were not greatly different from the case with the first row, accordingly the indentations and the numbers of captured particles were observed in a similar manner to the case with the other output bumps 25 in the second row and the third row, and it is considered that satisfactory electrical conduction was implemented by squashing of the electrically conductive particles. Furthermore since, with the connection body samples according to Examples 1 to 4, the electrically conductive particles were also appropriately squashed at the center of the third output bump row 26_-3, it was possible to clearly check the indentations upon the electrically conductive particles that appeared at the rear surface of the glass boards 12 for evaluation, and it was also possible to perform checking of the electrical continuity due to the indentations with good accuracy.

On the other hand, in Comparative Example 1, at the convex regions of the output bumps 25 at the central portions of the first and third output bump rows 26_-1 and 26_-3, bumps were present for which no particle indentations on their convex regions were observed, and there is a fear that electrical continuity was deteriorated due to the squashing of the electrically conductive particles being insufficient. This is due to the fact that, since the electrically conductive particles were randomly dispersed, accordingly, variations existed in the numbers of particles that were captured by the convex regions. Accordingly, in Comparative Example 1, electrically conductive particles were not carried upon the convex regions, and it is probably not possible to avoid the occurrence of bumps having poor electrical continuity and/or poor electrical continuity reliability.

REFERENCE SIGNS LIST

1 Anisotropic conductive film
2 Release film

3 Binder resin layer
4 Electrically conductive particle
6 Winding reel
10 Liquid crystal display panel
11, 12 Transparent board
12a Edge
13 Seal
14 Liquid crystal
15 Panel display unit
16, 17 Transparent electrode
18 Liquid crystal drive IC
18a Mounting surface
19 Input terminal
20 Input terminal row
21 Output terminal
22 Output terminal row
23 Input bump
25 Output bump
24 Input bump row
26 Output bump row
27 Mounting portion
31 Board side alignment mark
32 IC side alignment mark
33 Thermocompression bonding head
35 Space between terminals

The invention claimed is:

1. A connection body comprising:
a circuit board comprising a plurality of terminals arranged into a plurality of terminal rows, the plurality of terminal rows being arranged in parallel to one another in a widthwise direction orthogonal to a direction in which the plurality of terminals are arranged; and
an electronic component comprising a plurality of bumps arranged into a plurality of bump rows corresponding to the plurality of terminal rows, the plurality of bump rows being arranged in parallel to one another in a widthwise direction orthogonal to a direction in which the plurality of bumps are arranged,
wherein
the electronic component is connected upon the circuit board interposed by an anisotropic conductive adhesive comprising electrically conductive particles arranged therein,
a distance between mutually opposing terminals of the plurality of terminals and bumps of the plurality of bumps arranged toward outer sides of the circuit board and the electronic component is greater than a distance between mutually opposing terminals of the plurality of terminals and bumps of the plurality of bumps arranged toward inner sides of the circuit board and the electronic component, and
a ratio D ($=D_o/D_i$) of a distance $D_o$ between mutually opposing the terminals and the bumps arranged toward the outer sides of the circuit board and the electronic component to a distance $D_i$ between mutually opposing the terminals and the bumps arranged toward the inner sides of the circuit board and the electronic component is within 130% of a ratio d ($=d_o/d_i$), at both ends of the plurality of bumps on the electronic component in a direction in which the plurality of bumps are arranged, of an average distance $d_o$ between mutually opposing terminals of the plurality of terminals and bumps of the plurality of bumps arranged toward the outer sides of the circuit board and the electronic component and an average distance $d_i$ between mutually opposing terminals of the plurality of terminals and bumps of the plurality of bumps arranged toward the inner sides of the circuit board and the electronic component.

2. The connection body according to claim 1, wherein the ratio D at the center portion of the plurality of bump rows on the electronic component is within 130% of the ratio d.

3. The connection body according to claim 1, the connection body being manufactured by using the anisotropic conductive adhesive comprising the electrically conductive particles arranged therein.

4. The connection body according to claim 1, wherein an average diameter of the electrically conductive particles is 5 µm or less.

5. The connection body according to claim 1, wherein, the plurality of bumps comprise concave and convex portions formed on bump surfaces that capture the electrically conductive particles, the concave and convex portions have a difference in elevation within 50% of a particle diameter of the electrically conductive particles.

6. The connection body according to claim 1, wherein the distance between mutually opposing the terminals and the bumps arranged toward the outer sides of the circuit board and the electronic component is within 130% of the distance between mutually opposing the terminals and the bumps arranged toward the inner sides of the circuit board and the electronic component.

7. The connection body according to claim 6, wherein, at a center portion of the plurality of bump rows on the electronic component, a distance between mutually opposing terminals of the plurality of terminals and bumps of the plurality of bumps arranged toward the outer sides of the circuit board and the electronic component is within 130% of a distance between mutually opposing terminals of the plurality of terminals and bumps of the plurality of bumps arranged toward the inner sides of the circuit board and the electronic component.

8. A connection body comprising:
a circuit board comprising a plurality of terminals arranged into a plurality of terminal rows, the plurality of terminal rows being arranged in parallel to one another in a widthwise direction orthogonal to a direction in which the plurality of terminals are arranged; and
an electronic component comprising a plurality of bumps arranged into a plurality of bump rows corresponding to the plurality of terminal rows, the plurality of bump rows being arranged in parallel to one another in a widthwise direction orthogonal to a direction in which the plurality of bumps are arranged,
wherein
the electronic component is connected upon the circuit board interposed by an anisotropic conductive adhesive comprising electrically conductive particles arranged therein,
a distance between mutually opposing terminals of the plurality of terminals and bumps of the plurality of bumps arranged toward outer sides of the circuit board and the electronic component is greater than a distance between mutually opposing terminals of the plurality of terminals and bumps of the plurality of bumps arranged toward inner sides of the circuit board and the electronic component, and
the circuit board comprises:
a first terminal region comprising a terminal row of the plurality of terminal rows formed in the first terminal region; and
a second terminal region comprising a plurality of terminal rows of the plurality of terminal rows arranged in parallel to one another in a widthwise direction;

the electronic component comprises
a first bump region comprising a bump row of the plurality of bump rows formed in the first bump region; and
a second bump region comprising a plurality of bump rows of the plurality of the bump rows arranged in parallel to one another in a widthwise direction; and
a distance $D_o$ between mutually opposing terminals of the plurality of terminals and bumps of the plurality of bumps arranged toward outer sides in the second terminal region and the second bump region of the circuit board and the electronic component is within 110% of an average distance $d_{AVE}$ of a distance between mutually opposing terminals of the plurality of terminals and bumps of the plurality of bumps at both end portions of a terminal row of the plurality of terminal rows and a bump row of the plurality of bump rows arranged toward outer sides in the second terminal region and the second bump region of the circuit board and the electronic component, and a distance between mutually opposing terminals of the plurality of terminals and bumps of the plurality of bumps at both end portions of the terminal row and the bump row in the first terminal region and the first bump region of the circuit board and the electronic component.

9. The connection body according to claim 8, wherein upon a plurality of terminal rows being arranged in parallel to one another in the first terminal region in a widthwise direction orthogonal to a direction in which the plurality of terminals are arranged and a plurality of bump rows being arranged in parallel to one another in the first bump region in a widthwise direction orthogonal to a direction in which the plurality of bumps are arranged, the terminal row and the bump row in the first terminal region and the first bump region are a terminal row of the plurality of terminal rows and a bump rows of the plurality of bump rows arranged toward outer sides in the first terminal region and the first bump region.

10. The connection body according to claim 8, wherein the distance $D_o$ at the center portion of the plurality of bump rows on the electronic component is within 110% of the average distance $d_{AVE}$.

11. The connection body according to claim 8, wherein, the plurality of bumps comprise concave and convex portions formed on bump surfaces that capture the electrically conductive particles, the concave and convex portions have a difference in elevation within 50% of a particle diameter of the electrically conductive particles.

12. A connection body comprising:
a circuit board comprising a plurality of terminals arranged into a plurality of terminal rows, the plurality of terminal rows being arranged in parallel to one another in a widthwise direction orthogonal to a direction in which the plurality of terminals are arranged; and
an electronic component comprising a plurality of bumps arranged into a plurality of bump rows corresponding to the plurality of terminal rows, the plurality of bump rows being arranged in parallel to one another in a widthwise direction orthogonal to a direction in which the plurality of bumps are arranged,
wherein
the electronic component is connected upon the circuit board interposed by an anisotropic conductive adhesive comprising electrically conductive particles arranged therein,
a distance between mutually opposing terminals of the plurality of terminals and bumps of the plurality of bumps arranged toward outer sides of the circuit board and the electronic component is greater than a distance between mutually opposing terminals of the plurality of terminals and bumps of the plurality of bumps arranged toward inner sides of the circuit board and the electronic component, and
the plurality of bumps comprise concave and convex portions formed on bump surfaces that capture the electrically conductive particles, the concave and convex portions have a difference in elevation within 50% of a particle diameter of the electrically conductive particles.

13. A method of manufacturing a connection body, the connection body comprising:
a circuit board comprising a plurality of terminals arranged into a plurality of terminal rows, the plurality of terminal rows being arranged in parallel to one another in a widthwise direction; and
an electronic component comprising a plurality of bumps arranged into a plurality of bump rows corresponding to the plurality of terminal rows, the plurality of bump rows arranged in parallel to one another in a widthwise direction, the method comprising the steps of;
mounting the electrical component onto the circuit board interposed by an anisotropic conductive adhesive comprising electrically conductive particles arranged therein; and
pressing the electrical component while hardening the anisotropic conductive adhesive,
wherein
a distance between mutually opposing terminals of the plurality of terminals and bumps of the plurality of bumps arranged toward outer sides of the circuit board and the electronic component is greater than a distance between mutually opposing terminals of the plurality of terminals and bumps of the plurality of bumps arranged toward inner sides of the circuit board and the electronic component and
a ratio $D$ ($=D_o/D_i$) of a distance $D_o$ between mutually opposing the terminals and the bumps arranged toward the outer sides of the circuit board and the electronic component to a distance $D_i$ between mutually opposing the terminals and the bumps arranged toward the inner sides of the circuit board and the electronic component is within 130% of a ratio d ($=d_o/d_i$), at both ends of the plurality of bumps on the electronic component in a direction in which the plurality of bumps are arranged, of an average distance $d_o$ between mutually opposing terminals of the plurality of terminals and bumps of the plurality of bumps arranged toward the outer sides of the circuit board and the electronic component and an average distance $d_i$ between mutually opposing terminals of the plurality of terminals and bumps of the plurality of bumps arranged toward the inner sides of the circuit board and the electronic component.

14. The method of manufacturing a connection body according to claim 13, wherein the anisotropic conductive adhesive comprises:
an electrically conductive particle containing layer containing the electrically conductive particles; and
an electrically insulating adhesive layer not containing the electrically conductive particles,
a viscosity of the electrically conductive particle containing layer is greater than a viscosity of the electrically insulating adhesive layer.

* * * * *